(12) United States Patent
Eberhard et al.

(10) Patent No.: US 10,574,365 B2
(45) Date of Patent: Feb. 25, 2020

(54) OPTICAL COMMUNICATIONS INTERFACE FOR BATTERY MODULES OF AN ENERGY STORAGE SYSTEM

(71) Applicant: InEVit LLC, Redwood City, CA (US)

(72) Inventors: Martin Eberhard, Woodside, CA (US); Alexander Eichhorn, Eppingen (DE); Andreas Track, Sachsenheim (DE); Heiner Fees, Bietigheim-Bissingen (DE)

(73) Assignee: TIVENI MERGECO, INC., San Mateo, CA (US)

( * ) Notice: Subject to any disclaimer, the term of this patent is extended or adjusted under 35 U.S.C. 154(b) by 0 days.

(21) Appl. No.: 15/730,927

(22) Filed: Oct. 12, 2017

(65) Prior Publication Data

US 2018/0109328 A1 Apr. 19, 2018

Related U.S. Application Data

(60) Provisional application No. 62/408,445, filed on Oct. 14, 2016, provisional application No. 62/414,208, (Continued)

(51) Int. Cl.
*H04B 10/00* (2013.01)
*H04B 10/80* (2013.01)
(Continued)

(52) U.S. Cl.
CPC ....... *H04B 10/806* (2013.01); *G01R 31/3644* (2013.01); *G02B 6/36* (2013.01);
(Continued)

(58) Field of Classification Search
USPC ....................................................... 398/9–38
See application file for complete search history.

(56) References Cited

U.S. PATENT DOCUMENTS 5,465,038 A * 11/1995 Register ............... H01M 10/46
235/375
5,705,929 A * 1/1998 Caravello .......... G01R 31/3648
324/430

(Continued)

FOREIGN PATENT DOCUMENTS

DE 19822571 A1 11/1999

OTHER PUBLICATIONS

International Search Report and Written Opinion dated Jan. 3, 2018 in International Application No. PCT/US2017/056612.

*Primary Examiner* — Agustin Bello
(74) *Attorney, Agent, or Firm* — Muncy, Geissler, Olds & Lowe, P.C.; Daniel Podhajny

(57) ABSTRACT

In an embodiment, a module-side optical transceiver is configured to exchange optical signals with a battery module controller (BMC)-side optical transceiver coupled to a BMC. The optical signals are transported inside of a tunnel space between the BMC and the battery module. In one embodiment, the optical signals are transported via a light tube, a deflection element such as a mirror, or a combination thereof. In another embodiment, the optical signals are transported via a cable harness coupled to a plurality of BMC-side optical transceivers in the tunnel space and configured to support optical line of sight (LoS) links to various module-side optical transceivers.

8 Claims, 28 Drawing Sheets

Related U.S. Application Data filed on Oct. 28, 2016, provisional application No. 62/422,090, filed on Nov. 15, 2016, provisional application No. 62/408,452, filed on Oct. 14, 2016, provisional application No. 62/444,853, filed on Jan. 11, 2017.

(51) Int. Cl.

| | | |
|---|---|---|
| *G01R 31/36* | (2020.01) | |
| *G02B 6/36* | (2006.01) | |
| *G02B 6/42* | (2006.01) | |
| *H04B 10/40* | (2013.01) | |

(52) U.S. Cl.
CPC ............ *G02B 6/42* (2013.01); *G02B 6/4206* (2013.01); *G02B 6/4246* (2013.01); *H04B 10/40* (2013.01)

(56) References Cited

U.S. PATENT DOCUMENTS

| | | | | |
|---|---|---|---|---|
| 5,739,671 A | * | 4/1998 | Hamada | H01M 10/46 320/149 |
| 6,882,129 B2 | * | 4/2005 | Boskovitch | H02J 7/0021 320/119 |
| 7,051,660 B2 | * | 5/2006 | Insana | B60M 7/003 104/162 |
| 7,155,075 B2 | * | 12/2006 | Rajendran | G01K 11/32 385/12 |
| 7,766,544 B2 | * | 8/2010 | Shibuya | B60K 1/04 374/152 |
| 7,782,014 B2 | * | 8/2010 | Sivertsen | H02J 7/0022 320/118 |
| 8,059,007 B2 | * | 11/2011 | Hermann | H01M 10/486 320/106 |
| 8,092,081 B2 | * | 1/2012 | Hermann | G01K 3/005 320/150 |
| 8,268,493 B2 | * | 9/2012 | Cetegen | G01K 11/003 429/427 |
| 8,691,416 B1 | * | 4/2014 | Carroll | H01M 10/625 429/100 |
| 9,203,122 B2 | * | 12/2015 | Raghavan | H01M 10/48 |
| 9,209,494 B2 | * | 12/2015 | Kiesel | H01M 10/42 |
| 9,413,042 B2 | * | 8/2016 | Golubkov | H01M 10/4257 |
| 9,553,465 B2 | * | 1/2017 | Raghavan | H02J 7/0052 |
| 9,583,796 B2 | * | 2/2017 | Saha | H01M 10/48 |
| 9,677,916 B2 | * | 6/2017 | Hegyi | G02B 6/12009 |
| 9,905,821 B2 | * | 2/2018 | Eberhard | H01M 2/105 |
| 10,160,492 B2 | * | 12/2018 | Fees | B60K 1/04 |
| 2009/0027009 A1 | * | 1/2009 | Sivertsen | H02J 7/0022 320/134 |
| 2009/0088062 A1 | * | 4/2009 | Major | B60H 1/00278 454/70 |
| 2010/0124250 A1 | * | 5/2010 | Lachenmeier | H01M 2/1613 374/152 |
| 2012/0275799 A1 | * | 11/2012 | Abraham | B60L 3/0046 398/200 |
| 2013/0314094 A1 | * | 11/2013 | Farmer | G01N 25/20 324/430 |
| 2013/0316198 A1 | * | 11/2013 | Bandhauer | G08C 17/02 429/50 |
| 2014/0092375 A1 | * | 4/2014 | Raghavan | H01M 10/48 356/32 |
| 2014/0203783 A1 | * | 7/2014 | Kiesel | H01M 10/42 320/134 |
| 2014/0312828 A1 | * | 10/2014 | Vo | H01M 10/4257 320/103 |
| 2015/0280290 A1 | * | 10/2015 | Saha | H01M 10/48 429/50 |
| 2016/0016482 A1 | * | 1/2016 | Lee | G01R 31/389 701/22 |
| 2016/0028129 A1 | * | 1/2016 | Raghavan | H01M 10/482 429/90 |
| 2017/0131357 A1 | * | 5/2017 | Nieva | H01M 10/48 |
| 2018/0006283 A1 | * | 1/2018 | Hill | B60K 1/04 |
| 2018/0097264 A1 | * | 4/2018 | Doerr | G01K 11/16 |
| 2018/0109328 A1 | * | 4/2018 | Eberhard | G01R 31/3644 |
| 2018/0162447 A1 | * | 6/2018 | Fees | B60K 1/00 |
| 2018/0239408 A1 | * | 8/2018 | Kuchibhatla | G06F 1/266 |
| 2018/0248233 A1 | * | 8/2018 | Schade | H01M 10/48 |

* cited by examiner

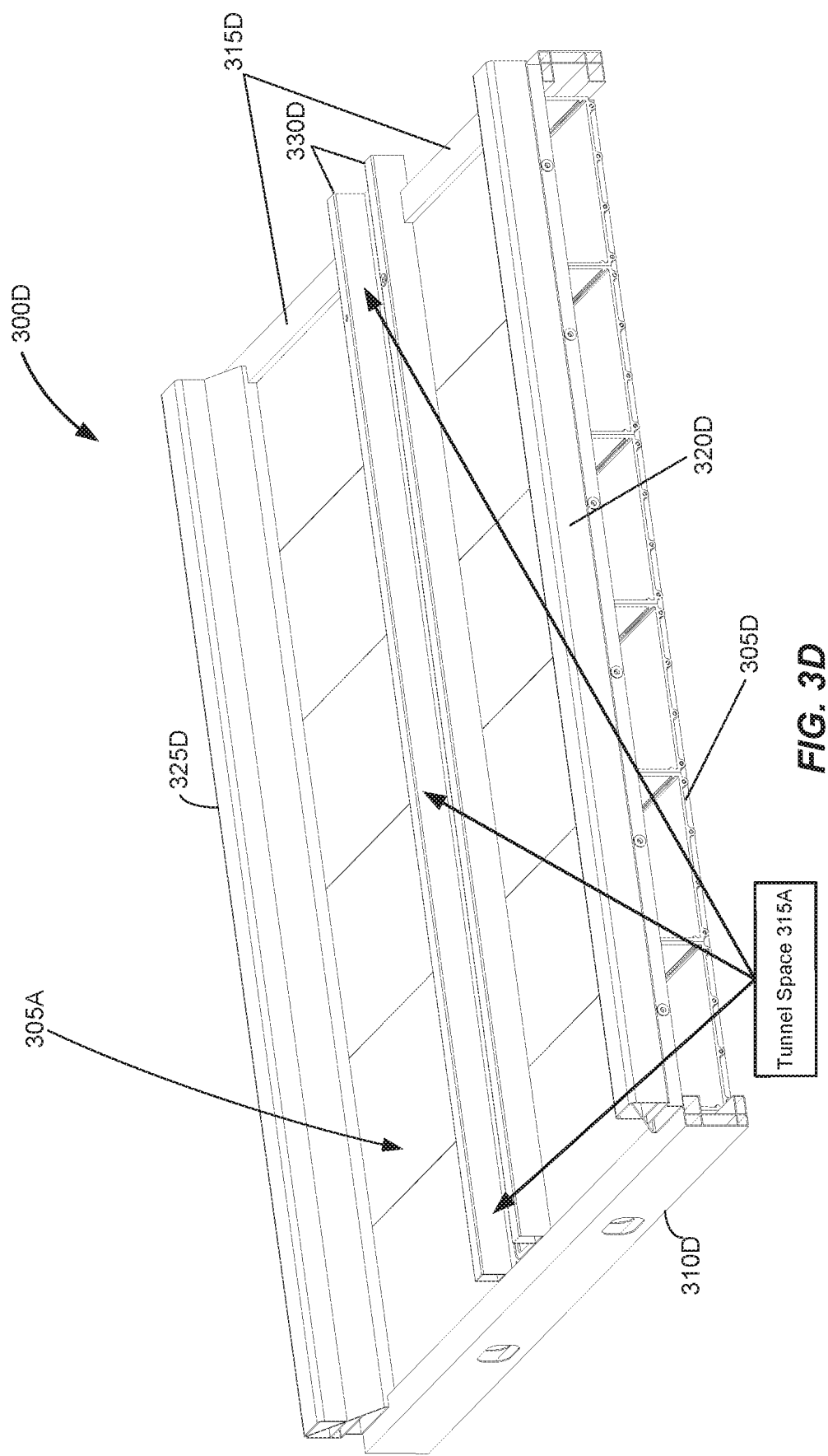

OPTICAL COMMUNICATIONS INTERFACE FOR BATTERY MODULES OF AN ENERGY STORAGE SYSTEM

CROSS-REFERENCE TO RELATED APPLICATIONS

The present application for patent claims the benefit of U.S. Provisional Application No. 62/408,445, entitled "CAR FLOOR SYSTEM WITH INTEGRATED BATTERY MODULES", filed Oct. 14, 2016, and also to U.S. Provisional Application No. 62/414,208, entitled "CAR FLOOR SYSTEM WITH INTEGRATED BATTERY MODULES", filed Oct. 28, 2016, and also to U.S. Provisional Application No. 62/422,090, entitled "CAR FLOOR SYSTEM WITH INTEGRATED BATTERY MODULES", filed Nov. 15, 2016, and also to U.S. Provisional Application No. 62/408,452, entitled "OPTICAL COMMUNICATION FOR CONTROLLING AUTOMOTIVE POWER SUBSYSTEM", filed Oct. 14, 2016, and also to U.S. Provisional Application No. 62/444,853, entitled "OPTICAL COMMUNICATION FOR CONTROLLING AUTOMOTIVE POWER SUBSYSTEM", filed Jan. 11, 2017, each of which is assigned to the assignee hereof and hereby expressly incorporated by reference herein in its entirety.

BACKGROUND

1. Field of the Disclosure

Embodiments relate to an optical communications interface for battery modules of an energy storage system.

2. Description of the Related Art

Energy storage systems may rely upon batteries for storage of electrical power. For example, in certain conventional electric vehicle (EV) designs (e.g., fully electric vehicles, hybrid electric vehicles, etc.), a battery housing mounted into an electric vehicle houses a plurality of battery cells (e.g., which may be individually mounted into the battery housing, or alternatively may be grouped within respective battery modules that each contain a set of battery cells, with the respective battery modules being mounted into the battery housing). The battery modules in the battery housing are connected in series via busbars to a battery junction box (BJB), and the BJB distributes electric power provided from the busbars to an electric motor that drives the electric vehicle, as well as various other electrical components of the electric vehicle (e.g., a radio, a control console, a vehicle Heating, Ventilation and Air Conditioning (HVAC) system, internal lights, external lights such as head lights and brake lights, etc.).

SUMMARY

An embodiment is directed to a battery module of an energy storage system, including a module-side optical transceiver configured to exchange optical signals with a BMC-side optical transceiver coupled to a BMC, the optical signals being transported inside of a tunnel space between the BMC and the battery module.

Another embodiment is directed to an optical communications system for an energy storage system, including a light tube arranged inside of a tunnel space between a BMC coupled to a BMC-side optical transceiver and a plurality of battery modules that are each coupled to a module-side optical transceiver, wherein the light tube is configured to transport optical signals between each of the module-side optical transceivers of the plurality of battery modules and the BMC-side optical transceiver.

Another embodiment is directed to a BMC of an energy storage system, including a BMC-side optical transceiver configured to exchange optical signals with module-side optical transceivers associated with a plurality of battery modules, the optical signals being transported via a light tube arranged inside of a tunnel space between the BMC and the plurality of battery modules.

Another embodiment is directed to an optical communications interface of an energy storage system, including a cable harness including a plurality of data communication cables that are coupled to a BMC, the cable harness being arranged inside of a tunnel space between the BMC and a plurality of battery modules, and a plurality of BMC-side optical transceivers that are each coupled to at least one cable in the cable harness and arranged inside of the tunnel space, the plurality of BMC-side optical transceivers being configured for optical communication with a respective plurality of module-side optical transceivers that are each coupled to a different battery module among the plurality of battery modules.

BRIEF DESCRIPTION OF THE DRAWINGS

A more complete appreciation of embodiments of the disclosure will be readily obtained as the same becomes better understood by reference to the following detailed description when considered in connection with the accompanying drawings, which are presented solely for illustration and not limitation of the disclosure, and in which:

FIG. 3D illustrates a battery housing reinforcement configuration in accordance with an embodiment of the disclosure.

DETAILED DESCRIPTION

Embodiments of the disclosure are provided in the following description and related drawings. Alternate embodiments may be devised without departing from the scope of the disclosure. Additionally, well-known elements of the disclosure will not be described in detail or will be omitted so as not to obscure the relevant details of the disclosure.

Energy storage systems may rely upon batteries for storage of electrical power. For example, in certain conventional electric vehicle (EV) designs (e.g., fully electric vehicles, hybrid electric vehicles, etc.), a battery housing mounted into an electric vehicle houses a plurality of battery cells (e.g., which may be individually mounted into the battery housing, or alternatively may be grouped within respective battery modules that each contain a set of battery cells, with the respective battery modules being mounted into the battery housing). The battery modules in the battery housing are connected in series via busbars to a battery junction box (BJB), and the BJB distributes electric power provided from the busbars to an electric motor that drives the electric vehicle, as well as various other electrical components of the electric vehicle (e.g., a radio, a control console, a vehicle Heating, Ventilation and Air Conditioning (HVAC) system, internal lights, external lights such as head lights and brake lights, etc.).

Figure 1:
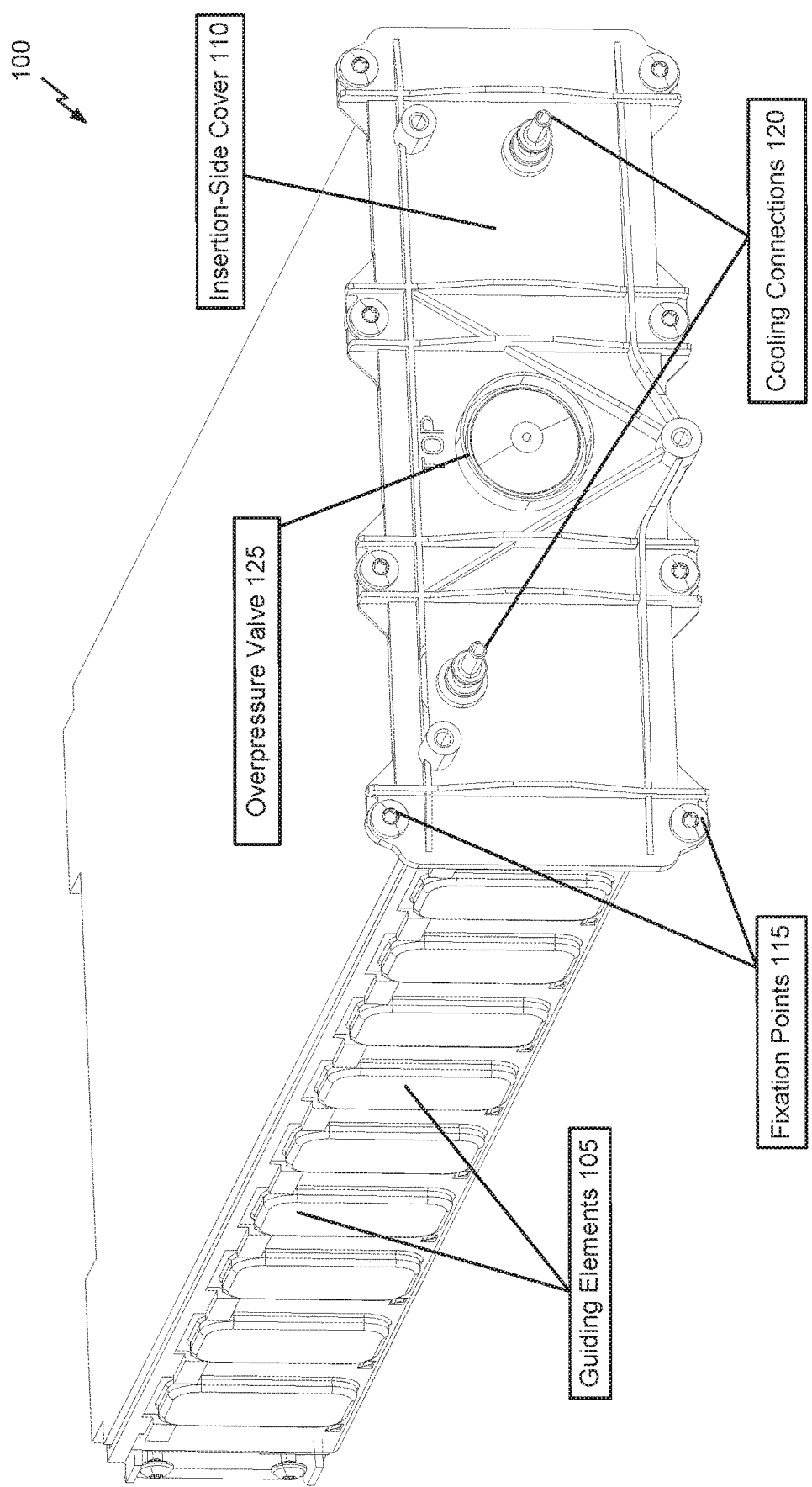
FIGS. 1-2 illustrate a front-perspective and a back-perspective, respectively, of an exterior framing of a battery module in accordance with an embodiment of the disclosure.
Figure 2:
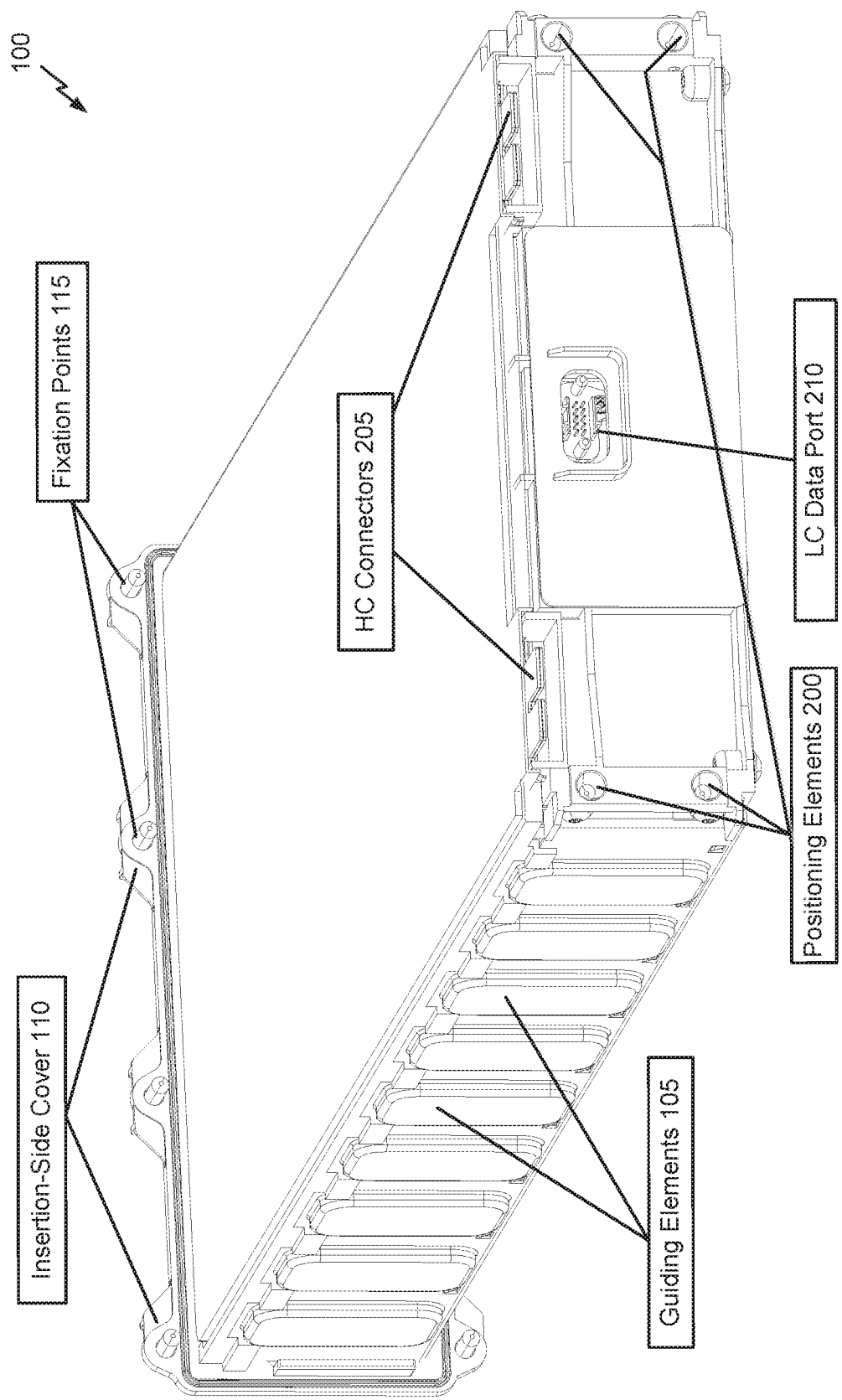

FIGS. 1-2 illustrate a front-perspective and a back-perspective, respectively, of an exterior framing of a battery module 100 in accordance with an embodiment of the disclosure. In the example of FIGS. 1-2, the battery module 100 is configured for insertion into a battery module compartment. For example, each side of the battery module 100 includes guiding elements 105 to facilitate insertion into (and/or removal out of) the battery module compartment. In a further example, the guiding elements 105 are configured to fit into grooves inside the battery module compartment to facilitate insertion and/or removal of the battery module 100. An insertion-side cover 110 (or endplate) is integrated into the battery module 100. Upon insertion, the insertion-side cover 110 may be attached or affixed to the battery module compartment (e.g., via fixation points 115, such as bolt-holes, etc.) to seal the battery module 100 inside the battery module compartment using a cover (or endplate) integrated sealing system (e.g., rubber ring, paper gasket, sealant adhesive, etc.). While the insertion-side cover 110 is depicted in FIGS. 1-2 as integrated into the battery module 100, the insertion-side cover 110 may alternatively be independent (or separate) from the battery module 100, with the battery module 100 first being inserted into the battery module compartment, after which the insertion-side cover 110 is attached.

Referring to FIGS. 1-2, the insertion-side cover 110 includes fixation points 115, a set of cooling connections 120, and an overpressure valve 125. In an example, the fixation points 115 may be bolt-holes through which bolts may be inserted, and the set of cooling connections 120 may include input and output cooling tube connectors (e.g., through which coolant fluid is pumped into the battery module 100 for cooling one or more cooling plates). The overpressure valve 125 may be configured to open when pressure inside of the battery module 100 exceeds a threshold (e.g., to avoid an explosion or overpressure by degassing in case of a thermal run away of a battery cell in the battery module 100).

In an alternative embodiment, the fixation points 115 and associated flange can be omitted, and a different fixation mechanism (e.g., a clip or clamp, such as a U-shaped clip) can be used to secure the battery module 100 inside a respective battery module compartment. For example, the insertion-side cover 110 may be clamped over the open insertion-side of the battery module compartment with a sheet metal band. The "band" may be rolled over the insertion-side cover 110 to cover part of the top and bottom of the battery housing, after which the rolled band is clamped (e.g., with a U-shaped clip). In an example, as a security feature, removing the rolled band so as to detach the insertion-side cover 110 may cause the rolled band to be damaged, such that unauthorized battery module removal can be detected (e.g., to void a vehicle warranty, etc.).

Referring to FIG. 2, the battery module 100 further includes a set of fixation and positioning elements 200 (e.g., to position and secure the battery module 100 in the battery module compartment while inserted), a set of high-current (HC) or power connectors 205 (e.g., to connect the battery module 100 to corresponding HC connectors in the battery module compartment), and a low-current (LC) data port 210 (e.g., to connect internal sensors of the battery module 100 to the BJB (not illustrated) via an LC module-to-tunnel interface (not shown in FIG. 2) in the battery module compartment). Accordingly, the battery module 100 is configured such that, upon insertion into the battery module compartment, the fixation and positioning elements 200, the HC connectors 205 and the LC data port 210 are each secured and connected to (e.g., plugged into, bolted or screwed to, etc.) corresponding connectors in the battery module compartment.

It will be appreciated that the battery module 100 is merely one example of a battery module configuration in accordance with embodiments of the disclosure. As will be described in more detail below, embodiments of the disclosure may encompass any battery module that includes an LC data port such as the LC data port 210 depicted in FIG. 2. Accordingly, the battery module 100 and associated components described with respect to FIGS. 1-2 should be interpreted as one exemplary exterior framing implementation for a battery module, whereas the various internal component configurations may alternatively be directed to other types of exterior framing (e.g., battery modules without guiding elements 105, battery modules that do not include an integrated insertion-side cover such as insertion-side cover 110, battery modules that position the HC connectors 205 on different sides from each other, and so on).

Various embodiments of the disclosure described herein relate to implementing an LC communications interface between battery modules of an energy storage system and a battery module controller (BCM). In some implementations, the BCM may be coupled to a BJB. In the embodiments described below, the LC communications interface between the battery modules of the energy storage system and the BCM is implemented inside of a defined tunnel space, which in certain implementations may be sealed or otherwise protected from dust, moisture, dirt, debris, and so on. As used herein, the LC communications interface terminology is used to broadly refer to different interface types. For example, for an optical communications interface, the LC communications interface may include a light tube. For a wired communications interface, the LC module-to-tunnel interface may include physical wiring or cabling and/or some type of wire or cable conduit, referred to as LC busbars.

FIGS. 3A-3D illustrate one exemplary configuration for defining a tunnel space for implementing an LC communications interface in accordance with embodiments of the disclosure.

Figure 3A:
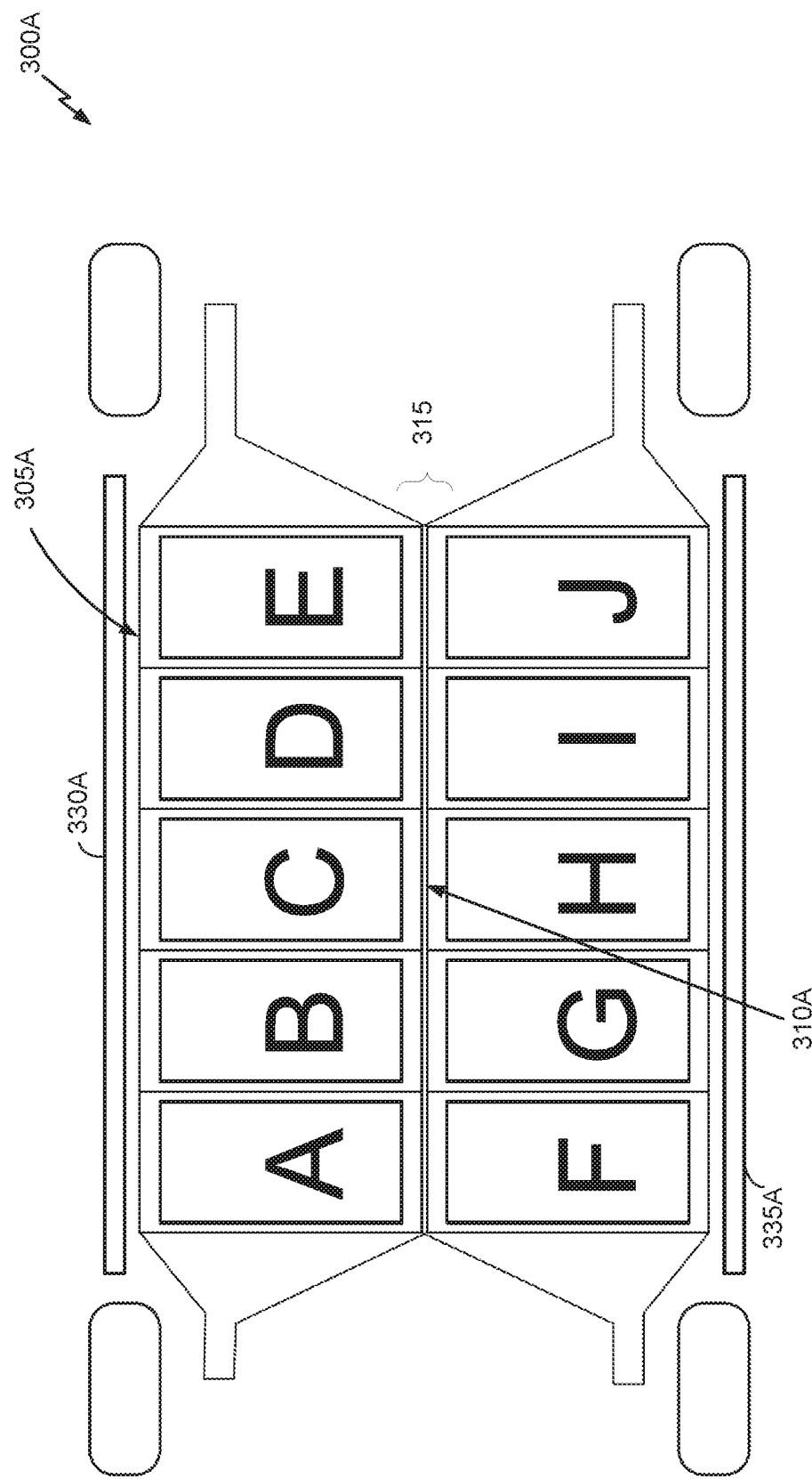
FIG. 3A illustrates a top-perspective of a cross-section of an electric vehicle including a battery housing in accordance with an embodiment of the disclosure.

FIG. 3A illustrates a top-perspective of a cross-section of an electric vehicle 300A including a battery housing 305A in accordance with an embodiment of the disclosure. FIG. 3A depicts various well-known components (e.g., wheels, axles, etc.) of the electric vehicle 300A to provide general context, but these components are not described in detail below for the sake of brevity. With respect to FIG. 3A and other FIGS described below, reference to battery "housing" and battery "module mounting area" is somewhat interchangeable. The battery module mounting area in FIG. 3A (and other FIGS described below) refers to an arrangement of battery module compartments configured to receive insertion of battery modules and to be sealed via insertion-side covers to form a battery housing. Further, in at least one embodiment, the battery module mounting area is part of a floor of the electric vehicle 300A.

Referring to FIG. 3A, the battery housing 305A includes ten battery module compartments denoted as A . . . J, and a middle bar 310A that is positioned between battery module compartments A . . . E and battery module compartments F . . . J on different longitudinal sides of the electric vehicle 300A. Each battery module compartment includes a frame (or plurality of walls) defining an interior space configured to fit a respective battery module, and an insertion-side which may be opened to facilitate insertion and/or removal of the respective battery module. The middle bar 310A may be constructed from the dividers (or firewalls) that separate laterally adjacent (e.g., aligned width-wise as a left/right pairing in the electric vehicle 300A) battery module compartments A . . . J (e.g., the firewall between battery module compartments A and F, the firewall between battery module compartments B and G, etc.).

In an example, the middle bar 310A may be one single longitudinal "bar" that extends across the entirety of the battery housing 305A. In this case, the interior side-walls of each battery module compartment may be attached to the middle bar 310A to form the battery module mounting area. In an alternative example, each laterally adjacent battery module compartment pair may be pre-constructed as a battery module compartment chamber with its own chamber-specific firewall for separating its respective laterally adjacent battery module compartments. The battery module compartment chambers may be stacked longitudinally to form the battery module mounting area, as will be discussed below with respect to FIGS. 3B-3C. In this case, the middle bar 310A is an aggregation of the individual firewalls contained in each respective battery module compartment chamber across the battery housing 305A.

While the middle bar 310A is illustrated in FIG. 3A as being centered in the battery housing 305A, the middle bar 310A can be positioned in other locations (e.g., closer to one side or the other, so as to fit differently-sized battery modules on left and right sides of the battery module mounting area) in other embodiments. Further, multiple middle bars could be deployed in other implementations. For example, a particularly wide vehicle may be equipped with a battery module mounting area that is wider than the lengths of two battery modules, such that a gap may be present between the two battery modules when inserted into a laterally adjacent pair of battery module compartments. In this case, two separate firewalls may be used for each laterally adjacent battery module compartment so that respective battery modules can comfortably fit therein, with a gap in-between the two firewalls. The two firewalls may form part of two separate "middle" bars (even though each respective firewall may be offset from a center or middle of the battery housing 305A), with the two separate middle bars either corresponding to two long "bars" extending across the battery housing 305A or two aggregations of chamber-specific firewalls from longitudinally stacked battery module compartment chambers. In at least one embodiment, the gap between the two separate middle bars may be used as a tunnel space (e.g., to facilitate optical communication, to run LC/HC busbars, etc.), although the embodiments describe below relate to an implementation where the tunnel space is defined above the battery module compartments, and not in a gap between laterally adjacent battery module compartments.

It will be appreciated that the battery housing 305A including ten battery module compartments A . . . J is shown in FIG. 3A for example purposes only. For example, an electric vehicle with a longer wheel base may be configured with a battery housing having more battery module compartments (e.g., 12, 14, etc.), while an electric vehicle with a shorter wheel base may be configured with a battery housing having fewer battery module compartments (e.g., 8, 6, etc.). The battery module compartments A . . . E are arranged longitudinally (i.e., lengthwise with respect to electric vehicle 300A) on a right-side of the electric vehicle 300A, while battery module compartments F . . . J are arranged longitudinally on a left-side of the electric vehicle 300A.

As used herein, a "battery module" is a package that contains a plurality of battery cells, such as lithium ion battery cells or battery cells made from a different electrode material. Battery modules may be configured with a prismatic or pouch battery cell arrangement (sometimes referred to as a soft pack), while other battery modules are configured with a cylindrical battery cell arrangement.

As used herein, a battery module compartment being "sealed" refers to a seal that is at least water-tight or liquid-tight, and optionally gas-tight (at least, with respect to certain gases such as smoke from fire, carbon, electrolyte particles, dust and debris, etc.). Generally, the sealing of the battery module compartments is a result of its interior walls being welded or glued together (where possible), and any connection interfaces (e.g., insertion-side cover, coolant interface plugs, electrical interface connectors, etc.) being sealed with a suitable type of sealant (e.g., O-ring, rubber gasket, sealing compound, etc.). While the sealing of the battery module compartments could potentially be hermetic (e.g., gas-tight with respect to all gases), hermetic sealing is not necessary (e.g., due to high cost). Accordingly, the sealing of the battery module compartments may be configured to block propagation of likely contaminants (e.g., liquids such as water, flames and/or smoke from fires, carbon, electrolyte particles, dust and debris, etc.) from entering into battery module compartments from an external environment and/or from exiting the battery module compartments towards a protected area (e.g., a passenger cabin of an electric vehicle). Moreover, while various embodiments described below relate to lateral or side-insertion of battery modules into respective battery module compartments, the insertion-side for the battery module compartments A . . . J may vary between different battery module mounting area configurations.

Referring to FIG. 3A, the middle bar 310A is configured to increase the overall stiffness of the battery housing 305A (and thereby, the electric vehicle 300A). In an example, the middle bar 310A may be positioned underneath a tunnel space 315A that, similar to the middle bar 310A, may be centered between battery module compartments A . . . E and battery module compartments F . . . J. As noted above, the battery module compartment firewalls that comprise the middle bar 310A limit propagation of hazards (e.g., excessive heat or fire, fluid leaks, etc.) between battery module compartments A . . . E and battery module compartments F . . . J. The tunnel space 315A optionally permits wireless communication (e.g., optical communication) between the battery modules inserted into the battery compartments A . . . J and a Battery Module Controller (BMC) at a Battery Junction Box (BJB), as will be discussed below in more detail. In an example, the tunnel space 315A may be outside of the battery module compartments A . . . J and effectively on 'top' of the battery housing 305A in the middle of the electric vehicle 300A (e.g., along the top of middle bar 310A). Alternatively, as noted above, instead of being defined over, or on 'top', of the battery housing 305A, the tunnel space 315A may instead be vertically aligned (or level) with the battery modules A . . . J in the battery housing 305A in-between adjacent battery module compartments on different lateral sides of the electric vehicle 300A (e.g., two interior walls or firewalls are used to seal each pair of laterally adjacent battery module compartments, with spaces in-between each pair of laterally adjacent battery module compartments defining the tunnel space 315A).

While not shown expressly in the top-perspective depicted in FIG. 3A, one or more busbars (e.g., high-current (HC), low-current (LC) busbars, etc.) may be deployed along the tunnel space 315A to provide electrical and/or communications connections between battery modules inserted into any of the battery module compartments A . . . J and a battery junction box (BJB). In an example, each battery module compartment may include HC connectors for connecting battery modules in adjacent battery module compartments in series. For example, the BJB may connect to an HC input connector on battery module compartment J, which is plugged into a battery module and connects to an HC output connector on battery module compartment J. The HC output connector connects to an HC busbar which is connected to an HC input connector on battery module compartment I, and so on. In this manner, the battery module in battery module compartment J may be daisy-chained in series to the battery module in battery module compartment I, which is in turn daisy-chained (in order) to battery modules in battery module compartments H, G, F, A, B, C, D and E, with the HC output connector in battery module compartment E being connected back to the BJB to complete the HC power connection between the BJB and the respective battery modules of the battery housing 305A. In an example, HC connectors may be paired together as a paired HC connector component, with an HC input connector and an HC output connector arranged on different sides of the paired HC connector component (e.g., such that the respective HC connectors are configured to connect to battery modules on different sides of the battery housing 305A). For example, a battery module in battery module compartment J may connect to an HC input connector portion of the paired HC connector component, with a battery module in battery module compartment E connecting to an HC output connector portion of the paired HC connector component.

Referring to FIG. 3A, as will be described below in more detail, each battery module compartment may also include an LC module-to-tunnel interface which facilitates a connection between the battery module and the BJB. As used herein, an LC "module-to-tunnel" interface is used to broadly refer to different interface types. For example, for an optical communications interface, the LC module-to-tunnel interface may include light guide(s) (or even an exposed air gap). For a wired communications interface, the LC module-to-tunnel interface may include physical wiring or cabling.

Unlike the HC interconnections described above, the LC communications interface from the BJB to the LC module-to-tunnel interfaces need not be daisy-chained to the other battery module compartments. In an example, the LC data port 210 of the battery module 100 may connect to a corresponding LC module-to-tunnel interface (e.g., via a plug) in the battery module compartment. The LC module-to-tunnel interface in the battery module compartment may function as a data interface between various LC components inside the battery module, such as sensors (e.g., temperature sensors, smoke sensors, etc.), and an LC communications interface (e.g., LC busbars, a light tube, etc.) in the tunnel space to the BJB. For example, the LC data port may be coupled to a module-side optical transceiver (e.g., an infrared (IR) transceiver), which may either be integrated into the battery module itself or part of the LC module-to-tunnel interface. The module-side optical transceiver is configured to emit optical signals into the tunnel space 315A (e.g., over a light tube, not shown in FIG. 3A) to a BMC-side optical transceiver of a Battery Module Controller (BMC) (e.g., which may be coupled to the BJB) to facilitate a data connection between the battery module and the BMC. Alternatively, the LC module-to-tunnel interface in the battery module compartment may simply be wired to the BMC via one or more wires (or LC busbars) that are run along the tunnel space 315A. In an example, using an optical communications interface for supporting the module-to-BMC data connection may simplify battery module installation in the sense that no control wiring is necessary to communicatively couple an installed battery module to the BMC (i.e., a technician can simply insert the battery module into a corresponding battery module compartment, which couples the battery module to the LC module-to-tunnel interface, which is coupled to LC busbars or an optical communications interface such as a light tube that bridges a connection to the BMC).

Further, the LC communications interface may facilitate a load balancing function at the respective battery modules, particularly if lithium ion batteries are used. For example, the load balancing function may involve precision voltage measurements for each parallel-group (or "P Group", whereby P Groups are groups of batteries in a particular battery module that are arranged in parallel to increase current and then connected in series with each other to increase voltage) in each battery module, as well as a mechanism for lightly discharging any P Group to bring the system into balance. Accordingly, each battery module may include load balancing circuitry, which may be controlled in part based on signaling exchanged over the LC communications interface with the BMC. Other functionality may also be obtained using the LC communications interface (e.g., temperature sensing and reporting, smoke detection and reporting to the BMC, etc.), as noted above.

In an example, centering the busbars along the tunnel space 315A in the middle of the electric vehicle 300A helps to isolate the busbars from crash impact zones (e.g., the left and right sides of the electric vehicle 300A), which in turn protects the busbars from crash impact-related damage. Also, defining the tunnel space 315A on top of the middle bar 310A, which may be configured as a strong metal 'spine' of the battery housing 305A, may likewise help to protect the busbars with the tunnel space 315A functioning as a relatively protected area (e.g., from crash impact-related damage, etc.). The tunnel space 315A may also function as an electromagnetic shield that protects the busbars from external electromagnetic interference. In an example, the HC busbars may be attached to a top-portion of the battery module compartments (e.g., see hole configurations in FIGS. 3B-3C where the LC module-to-tunnel interface and HC connectors may be inserted) in proximity to the firewall(s), so that the tunnel space 315A remains substantially empty, which may facilitate LC busbars or an optical communications interface to be deployed therein. The central busbars may include LC busbars and HC busbars, as noted above, although the LC busbars may be omitted if an optical communications interface (e.g., a light tube) is implemented (e.g., because LC wiring is not required to communicate with the individual battery modules).

With respect to the embodiment whereby the tunnel space 315A is defined on 'top' of the battery housing 305A, in an example, each pair of laterally adjacent battery module compartments may include a set of holes located proximately to the tunnel space 315A and aligned perpendicular to a direction in which the battery module is inserted or removed (e.g., for lateral or side-insertion, the holes may be on an upper wall or top wall of the battery module compartment). An LC module-to-tunnel interface and HC connectors are mounted into the set of holes for connecting battery modules to an LC busbar (e.g., or an optical communications interface) and HC busbars in the tunnel space 315A. For example, HC connectors and an LC module-to-tunnel interface may be inserted into the set of holes, and then secured and sealed. Then, when a battery module is inserted into the battery module compartment, electrical interfaces (e.g., HC connectors) of the battery module are aligned with the HC connectors and the LC data port of the battery module is aligned with the LC module-to-tunnel interface of the battery module compartment, such that the electrical interfaces of the battery module are plugged into the HC connectors upon full insertion into the battery module compartment, and the electrical interfaces of the battery module are disconnected from the HC connectors when removed from the battery module compartment. In an example, HC connectors and an LC module-to-tunnel interface may interface with battery modules on both sides of the battery module mounting area. As noted above, the HC connectors may each be configured within a paired HC connector component, whereby each paired HC connector component includes a first HC connector configured for coupling to a battery module in a first battery module compartment on one lateral side (e.g., left side or right side) of the battery module mounting area, and also a second HC configured for coupling to a second battery module on the other lateral side (e.g., left side or right side) of the battery module mounting area.

Moreover, battery modules in battery module compartments that are adjacent to each other longitudinally (as opposed to laterally adjacent battery modules) may be electrically coupled to each other via the HC busbars in series, as noted above. In FIG. 3A, this means that 'neighbor' battery modules in battery compartments A and B are electrically coupled, that 'neighbor' battery modules in battery compartments B and C are electrically coupled, and so on. This electric coupling can be chained from battery module compartment to battery module compartment with HC being available at the BJB once a last battery module is inserted (e.g., each of battery module compartments A . . . J).

The LC module-to-tunnel interface and HC connectors may be sealed (e.g., via a plastic cover, a rubber gasket, a sealing adhesive, a sealing ring such as an O-Ring in an axial or a radial direction, etc.) so that each battery module compartment is sealed. In an example, the LC and HC busbars may be secured to the respective LC and HC connectors via screwing. Alternatively, instead of an LC busbar, an optical communications interface may be used.

In an example, positioning the HC busbars in the tunnel space 315A may permit workers (e.g., assembly workers at a vehicle assembly plant during assembly of the electric vehicle 300A, maintenance workers, etc.) access to a particular subset of battery module compartments without being exposed to voltage and current from battery modules outside of the particular subset of battery module compartments. For example, as noted above, the HC connectors of the respective battery module compartments may be positioned in an interior or centered portion of the electric vehicle 300A, while the workers may be located outside the electric vehicle 300A for a lateral module insertion scenario, thereby shielded from the central HC busbars.

In particular, during insertion of a battery module that includes an integrated cover (or endplate), the worker may insert the battery module into a battery module compartment and couple the battery module to at least one corresponding busbar (e.g., via connectors to LC and HC busbars, such as plugs, where the battery module coupling may occur by virtue of the worker pushing or sliding an electrical interface of the battery module into the corresponding connector), and then secure (e.g., by tightening bolts, etc.) the cover (or endplate) to the battery module compartment so that the battery module compartment is sealed. Likewise, during removal, the worker may free or unlock the cover attachment mechanism (e.g., by removing bolts, etc.), and may then slide the battery module out of the battery module compartment. Hence, in at least one embodiment, during either insertion or removal, the worker only accesses the battery module(s) inside one particular subset of battery module compartments and its associated busbar(s) at a time without exposing the workers to the HC busbars.

In an embodiment, the BJB may also be positioned in a middle or center (longitudinally) of the electric vehicle 300A on top of the battery housing 305A. For example, to simplify and/or shorten HC routing and improve safety, the BJB may be positioned at one end of the battery housing 305A above the battery module compartments E and J, or alternatively at the other end of the battery housing 305A above the battery module compartments A and F). In an example, positioning the BJB in the middle of the electric vehicle 300A above the tunnel space 315A may reduce an electrical connection length between the BJB and electrical connections to the battery modules due to the busbars being run along the tunnel space 315A. However, it will be appreciated that the BJB can be placed anywhere in the electric vehicle 305 and is not required to be installed proximately to the battery housing 305A.

The battery housing 305A described above with respect to FIG. 3A may be based on various battery module mounting area configurations, such as a lateral-inserted battery module mounting area configuration (e.g., battery modules are inserted into a battery module mounting area from the left and right sides of an electric vehicle) which is used to describe various embodiments below. However, while not expressly illustrated, other battery module mounting area configurations are possible, such as vertically-inserted battery module mounting area configurations (e.g., battery modules are inserted into a battery module mounting area from the top or bottom sides of an electric vehicle), hinged-inserted battery module mounting area configurations (e.g., battery module compartments are attached to hinges so that the battery module compartments rotate upwards and downwards via the hinges for battery module insertion), and so on.

Figure 3B:
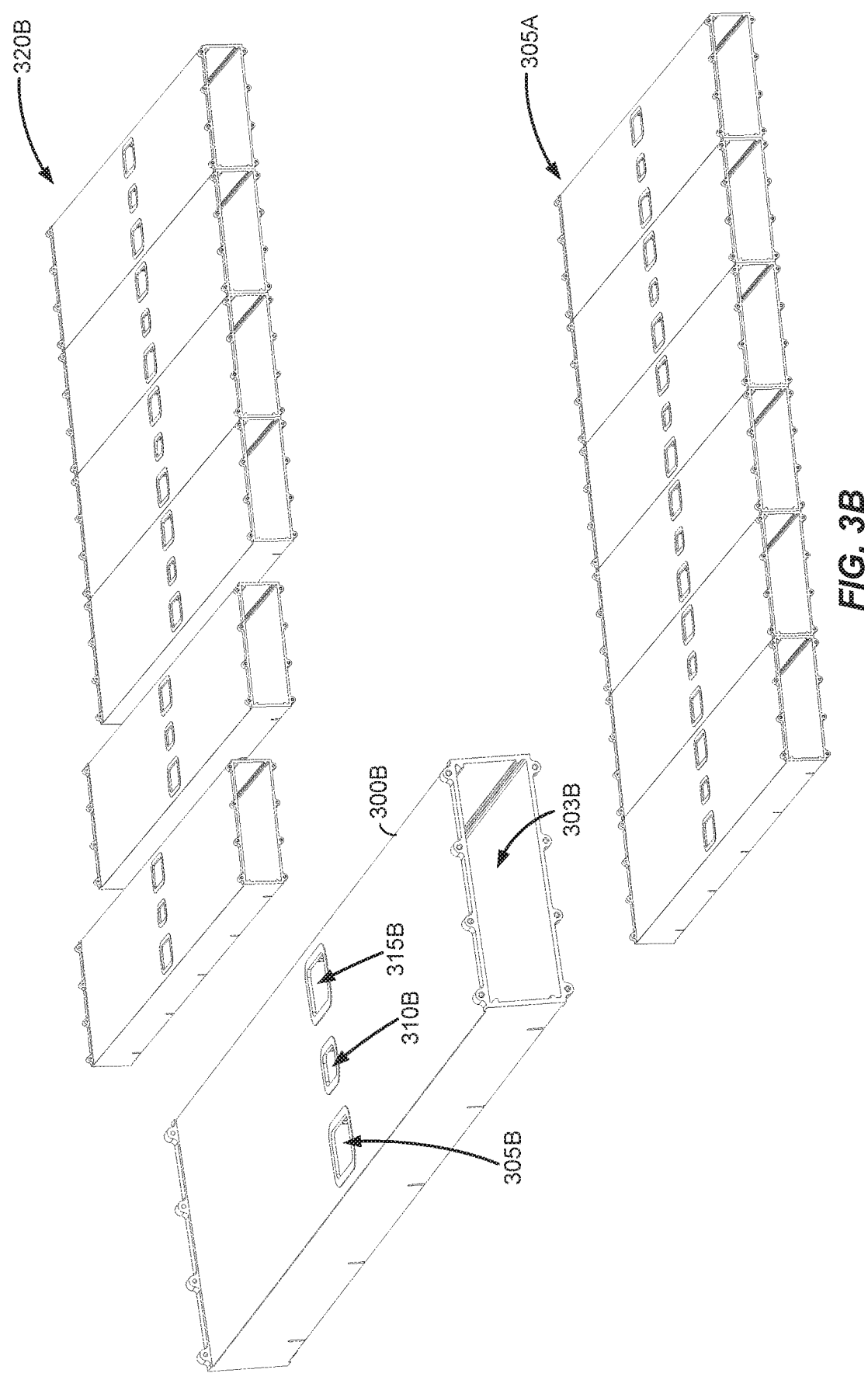
FIG. 3B illustrates example construction of a lateral-inserted battery module mounting area configuration in accordance with an embodiment of the disclosure.

FIG. 3B illustrates example construction of a lateral-inserted battery module mounting area configuration in accordance with an embodiment of the disclosure. In FIG. 3B, the battery module mounting area 305A is shown as being constructed from a series of battery module compartment chambers 300B. Each battery module compartment chamber 300B is configured with a battery module compartment on each side as a paired battery module compartment arrangement, with each battery module compartment configured to receive a respective battery module. The battery module compartment chamber 300B includes a plurality of exterior walls that define an exterior frame of the battery module compartment chamber 300B, and at least one interior wall (not shown in FIG. 3B) that acts as a firewall between the respective battery module compartments of the battery module compartment chamber 300B and separates (and forms a seal with respect to) the respective battery module compartments. In particular, the at least one interior wall (or firewall) may help to fix the respective battery modules into a desired position upon insertion, to protect each respective battery module compartments from hazards in the other battery module compartment, guide crash forces, support connectors for LC and/or HC interfaces and/or reduce a risk that the battery housing itself will collapse. In an example, the battery module compartment chamber 300B may include at least one interior wall to seal the respective battery module compartments from each other while defining a tunnel space located above the battery housing). Further, in an example, each interior wall of the battery module compartment chamber 300B may be comprised of a single sheet of sheet metal or a sandwich of sheet metal.

Referring to FIG. 3B, an insertion-side (or opening) 303B is shown on one particular exterior-facing side of the battery module compartment chamber 300B. While not shown explicitly in FIG. 3B, an identical insertion-side is arranged on the opposing exterior-facing side of the battery module compartment chamber 300B. The respective insertion-sides are each configured to permit respective battery modules to be inserted into the respective interior spaces of the respective battery module compartments which are part of the battery module compartment chamber 300B. In an example, each respective insertion-side of the battery module compartment chamber 300B is configured to be closed via respective lateral insertion-side covers so that each battery module compartment in the battery module compartment chamber 300B is sealed from the other battery module compartment. Because each battery module compartment chamber 300B may be stacked longitudinally with respect to the electric vehicle as shown at 320B, the two battery module compartments in each particular battery module compartment chamber 300B are considered to be laterally paired (e.g., left-side and right-side paired battery module compartments at the same longitudinal location along the battery module mounting area).

In FIG. 3B, holes 305B, 310B and 315B are configured under the tunnel space. In an example, a paired HC connector component may be inserted into each of the holes 305B and 315B to electrically couple the respective battery modules to HC busbars, and a pair of LC module-to-tunnel interfaces may be inserted into the hole 310B to communicatively couple an LC communications interface (e.g., an LC busbar or optical communications interface) to LC data ports of the respective battery modules. As noted above, the LC communications interface may be a wired interface that runs along the tunnel space and connects directly to the BMC, or alternatively may be an optical communications interface (e.g., an IR interface) that is communicatively coupled to a corresponding optical transceiver coupled to the BMC. The respective battery module compartment chambers 300B may be connected (or stacked) side-by-side longitudinally in series (e.g., via welding, gluing, etc.) as shown at 320B to construct the battery module mounting area 305A. In an example, each battery module compartment chamber 300B may be independently constructed separate from the actual assembly of the battery module mounting area, and then attached together during the assembly to quickly assemble the battery module mounting area.

The LC module-to-tunnel interfaces and HC connectors mounted into the top-holes 305B, 310B and 315B of the battery module compartment chamber 300B may be equipped with electrical coupling interfaces (e.g., LC/HC plugs or sockets) to the respective battery modules (as well as the HC busbars and LC communications interface) that are configured to be sealed with an O-ring (e.g., so that the respective battery module compartments are sealed while also protecting the tunnel space against hazards in the respective battery module compartments). Alternatively, the LC data ports may be integrated with optical transceivers in the respective battery modules, in which case an electrical connection between the LC module-to-tunnel interfaces and the LC data ports is not needed.

Accordingly, when the battery modules are fully inserted into the respective battery module compartments of the battery module compartment chamber 300B, the battery module compartments are sealed off from each other (e.g., via walls, covers, and O-rings), while still being connected to both the HC busbars and LC communications interface. The sealing of the battery module compartments helps to protect against hazards (e.g., water, excessive heat or fire, gas, etc.) in one battery module compartment from spreading or propagating through the battery housing.

Figure 3C:
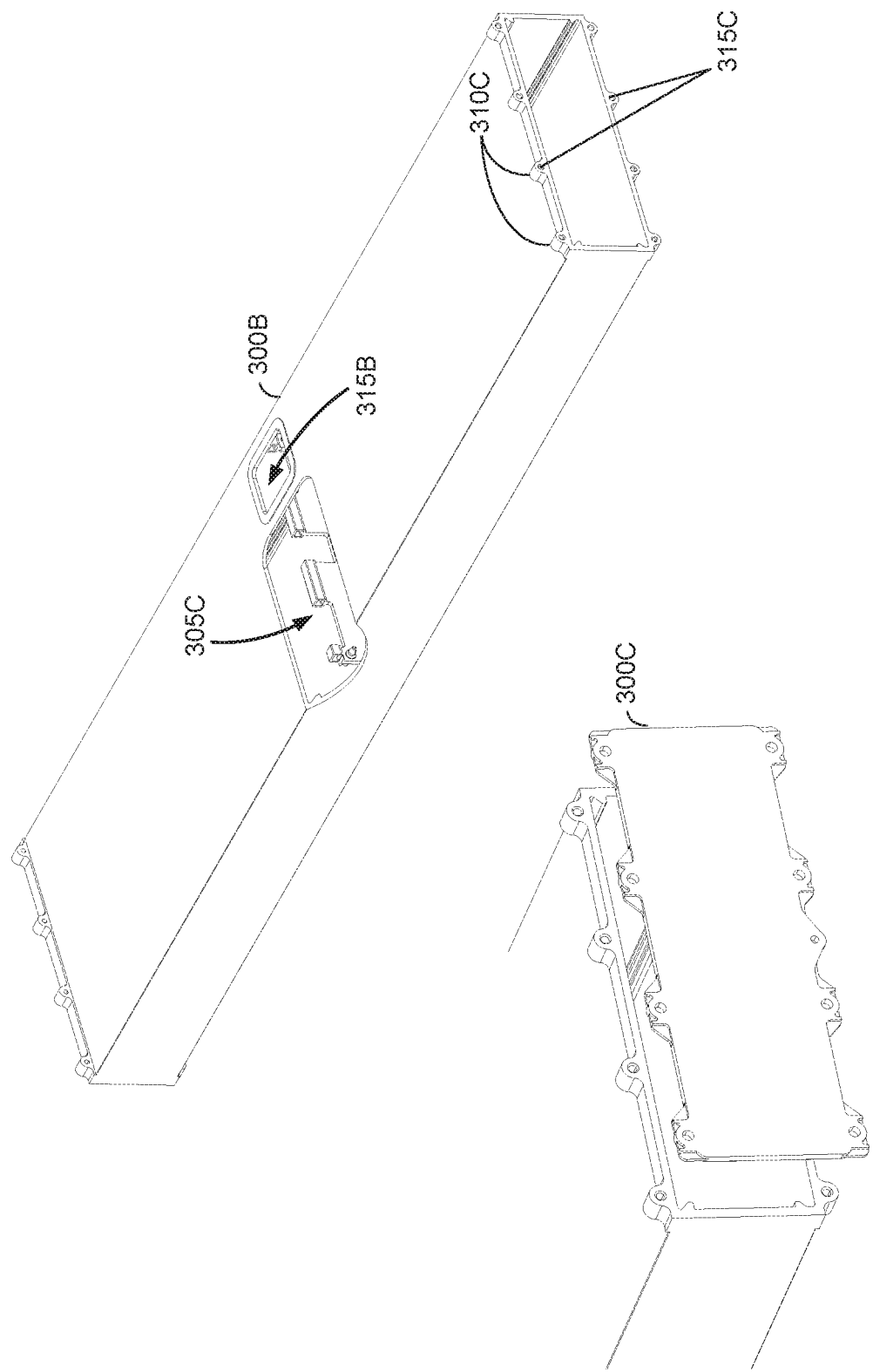
FIG. 3C illustrates an example of a battery module compartment chamber in accordance with an embodiment of the disclosure.

FIG. 3C illustrates an example of the battery module compartment chamber 300B of FIG. 3B in more detail in accordance with an embodiment of the disclosure. In FIG. 3C, the lateral opening at each battery module compartment of the battery module compartment chamber 300B may be sealed via a cover 300C. In alternative embodiments, a cover configured to seal multiple battery module compartments across different adjacent battery module compartment chambers 300B may be used, as discussed above. While the cover 300C in FIG. 3C is shown as an independent component, the cover 300C may alternatively be integrated with a respective battery module prior to installation into a battery module compartment of the battery module compartment chamber 300B.

Referring to FIG. 3C, an interior firewall 305C that seals a respective battery module compartment of the battery module compartment chamber 300B from the other battery module compartment, and also forms part of the middle bar 310A, is shown by omitting a portion of the top-side of the battery module compartment chamber 300B from view. While not shown, in an example where the tunnel space is formed between the laterally adjacent battery module compartments (instead of being above the battery housing), another interior wall that seals the other battery module compartment from the tunnel space may also be part of the battery module compartment chamber 300B to define the gap for the tunnel space. A flange 310C and a set of integrated fixation points 315C for securing the cover 300C to the battery module compartment chamber 300B, and sealing the respective battery module compartment, are also shown in FIG. 3C. The cambers of battery module compartment chamber 300B are divided by the interior walls 305C.

FIG. 3D illustrates a battery housing reinforcement configuration 300D in accordance with an embodiment of the disclosure. Referring to FIG. 3D, once the battery module mounting area 305A is constructed, the battery module mounting area 305A may be reinforced with a bottom-mounted bar 305D (e.g., underneath the flange), a front-mounted bar 310D, a back-mounted bar 315D, side-mounted bars 320D-325D and a set of center-mounted bars 330D. In an example, the set of center-mounted bars 315D may be used to define a gap that is used as the tunnel space 315A above the battery housing 305A. While not shown expressly in FIG. 3D, the tunnel space 315A may be formed when the above-noted gap is closed or sealed via a top-cover (e.g., formed from sheet metal), as well as being sealed at respective longitudinal ends of the tunnel space 315A.

Figure 4:
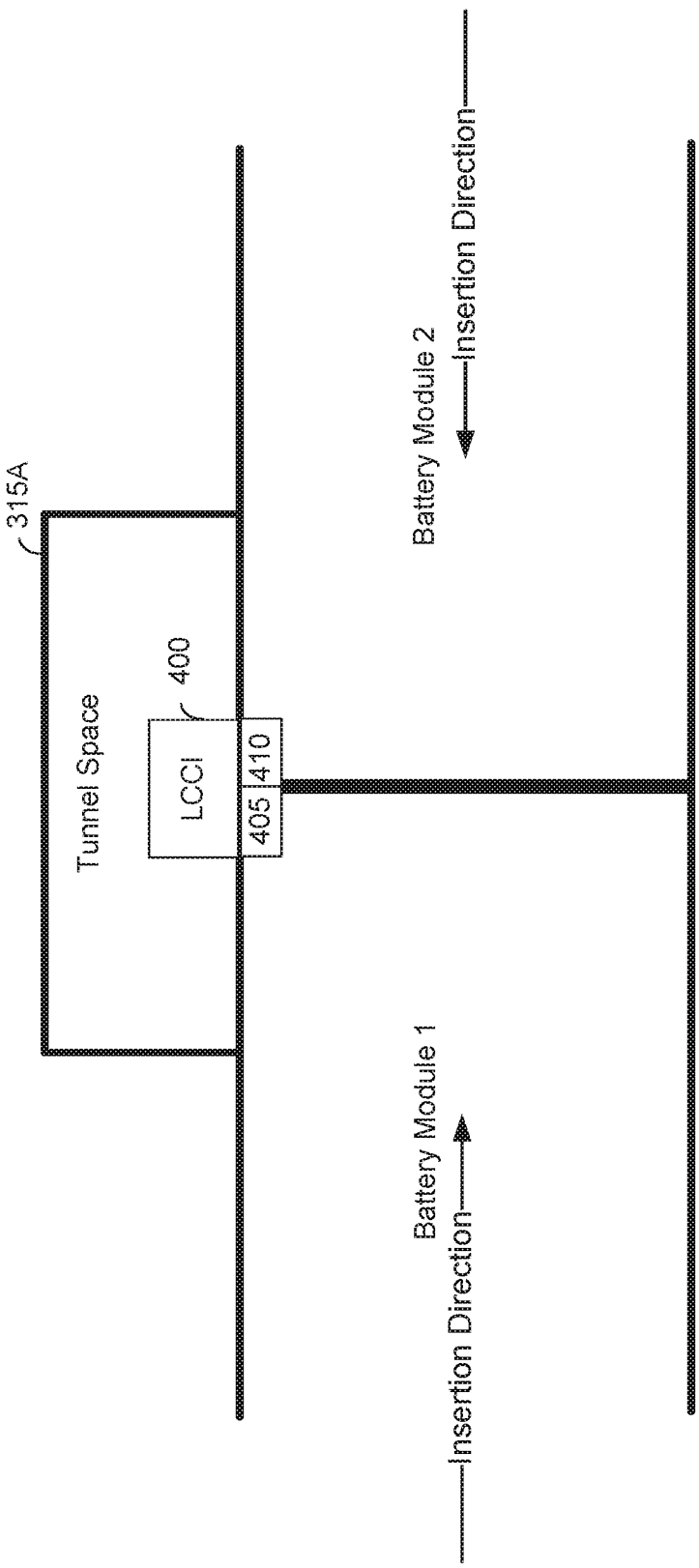
FIG. 4 illustrates a side-perspective of laterally adjacent battery modules connected to a low current (LC) communications interface in accordance with an embodiment of the disclosure.

FIG. 4 illustrates a side-perspective of laterally adjacent battery modules 1 and 2 connected to an LC communications interface 400 in accordance with an embodiment of the disclosure. In FIG. 5, blocks 405 and 410 denote connections between LC data ports and LC module-to-tunnel interfaces of battery modules 1 and 2, respectively. The respective connections 400 and 405 are used to facilitate communication between battery modules 1 and 2 and the BMC (not shown) over the LC communications interface 400 (e.g., physical cabling, light tube, etc.) inside the tunnel space 315A. As noted above, the LC communications interface 400 may be either wired or optical.

Figure 5A:
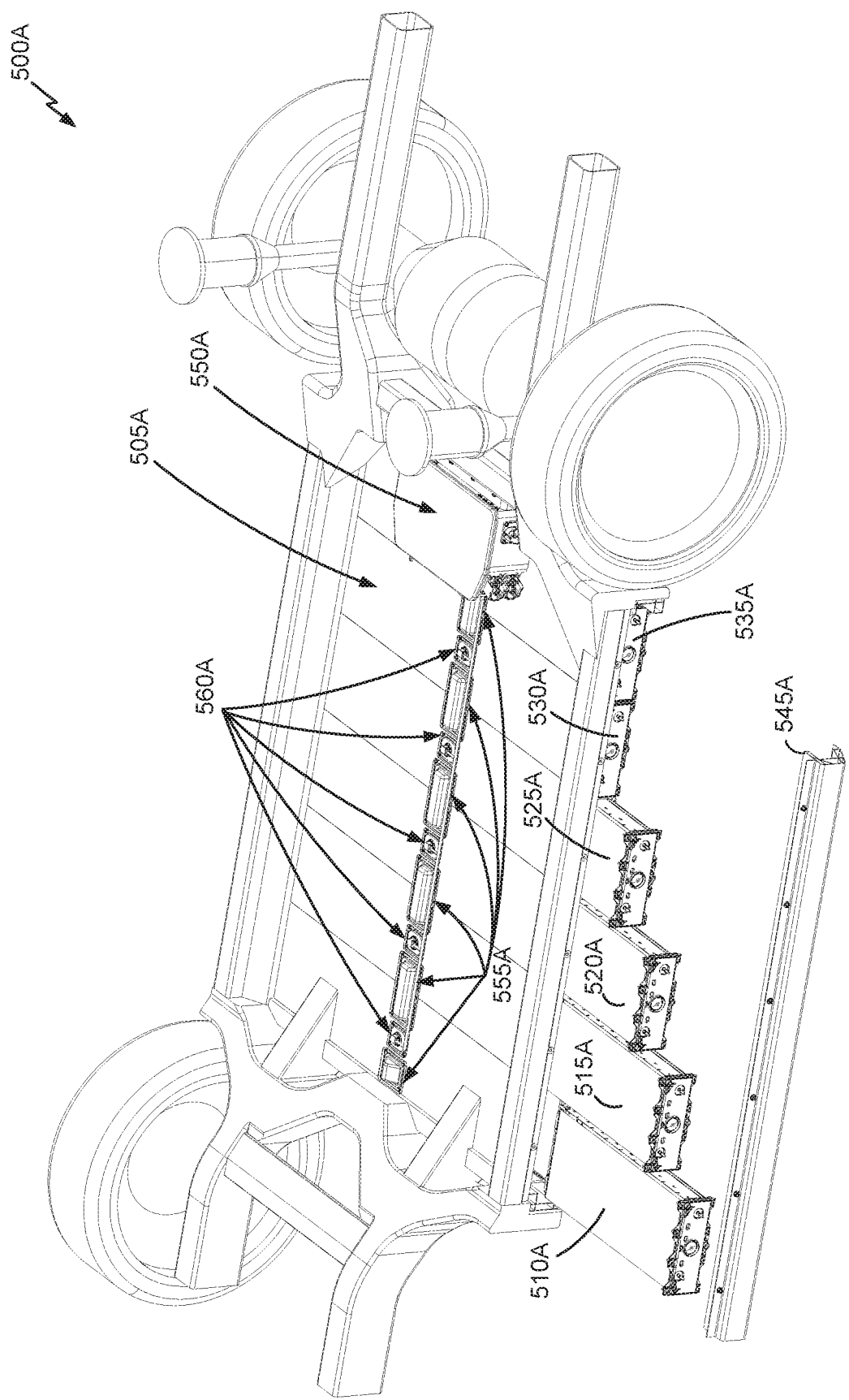
FIGS. 5A-5B illustrate examples whereby a wired LC communications interface between battery modules of an electric vehicle and a battery module controller (BMC) is implemented in accordance with embodiments of the disclosure.
Figure 5B:
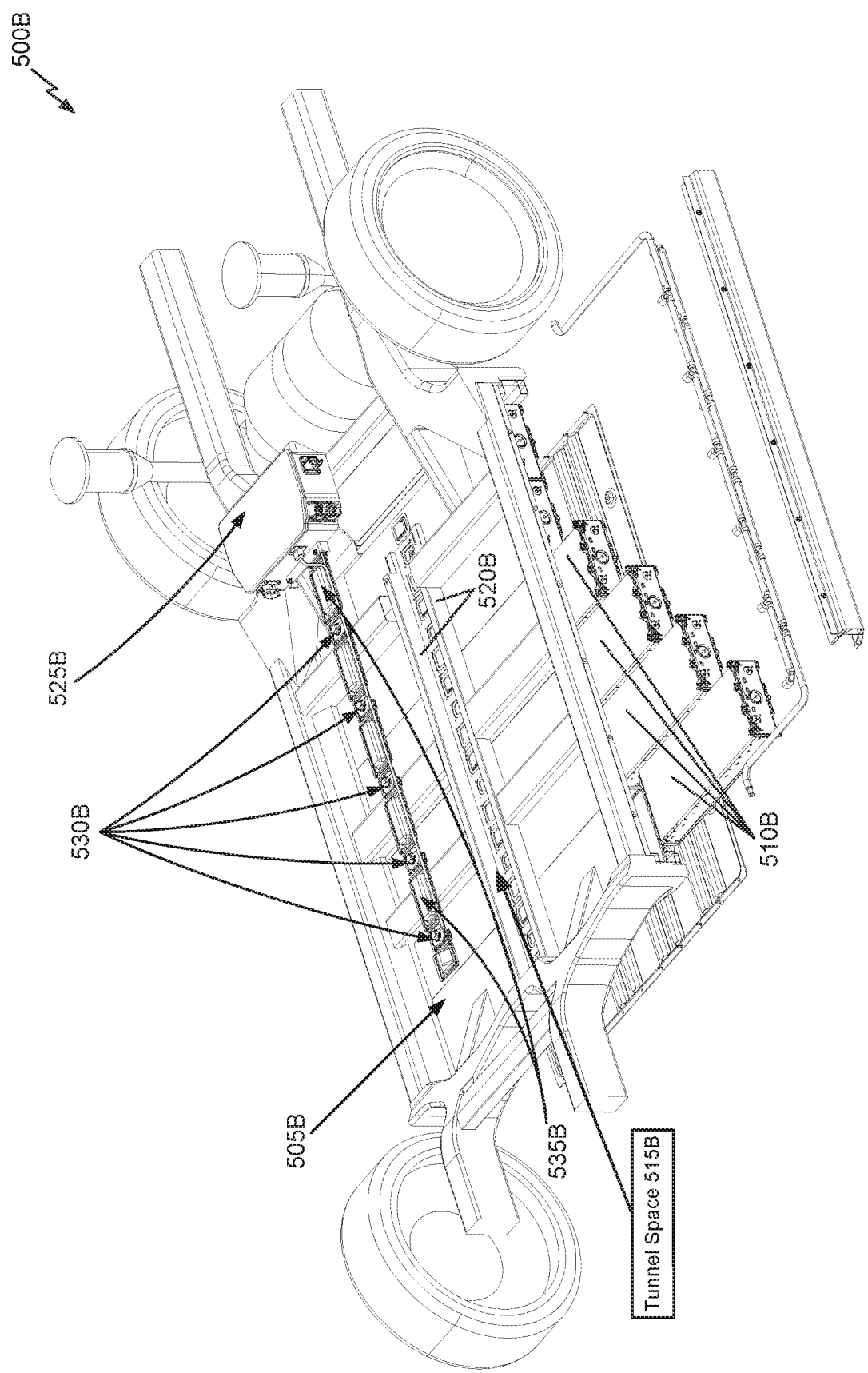

FIGS. 5A-5B illustrate examples whereby a wired LC communications interface between battery modules of an electric vehicle and a BMC is implemented in accordance with embodiments of the disclosure. In particular, FIGS. 5A-5B illustrate examples specific to a lateral-inserted battery module mounting area configuration for a battery housing of an electric vehicle.

Referring to FIG. 5A, an electric vehicle 500A includes a battery module mounting area 505A that includes, on a left side of the electric vehicle 500A, battery module compartments configured to receive battery modules 510A-535A via left-side lateral insertion. In FIG. 5A, battery modules 510A-525A are shown at different degrees of lateral insertion, while battery modules 530A-535A are shown in a fully-inserted state. While not shown explicitly in FIG. 5A, the battery module mounting area 505A may further include, on a right side of the electric vehicle 500A, battery module compartments configured to receive other battery modules 510A-535A via right-side lateral (or side) insertion. More specifically, the insertion-sides of the battery modules 510A-535A correspond to the left exterior-facing lateral side of each respective battery module compartment on the left side (longitudinally) of the electric vehicle 500A, and the insertion-sides of the battery modules of each respective battery module compartment on the right side (longitudinally) correspond to the right exterior-facing lateral side of the electric vehicle 500A. Rocker panel 545A may be attached to the electric vehicle 500A.

Referring to FIG. 5A, a BJB 550A is mounted on top of the battery module mounting area 505A, and is electrically connected to the battery modules 510A-535A (and also the right-side battery modules, which are not shown explicitly in FIG. 5A) via HC busbars 555A. Further, a BMC (not shown) coupled to the BJB 550A is communicatively coupled to each battery module via LC busbars 560A. In the embodiment of FIG. 5A, the LC busbars 560A are implemented as wires inside of some type of sheathing or conduit. In an example, each of the LC busbars 560A may support one battery module or a pair of laterally adjacent battery modules. While not shown expressly in FIG. 5A, the HC busbars 555A and LC busbars 560A may each be deployed in a protected tunnel space.

Referring to FIG. 5B, another electric vehicle 500B is depicted with a battery module mounting area 505B. The battery module mounting area 505B is configured similarly to the battery module mounting area 505A in FIGS. 3A-3D. Various battery modules 510B are shown at various degrees of insertion into the battery module mounting area 505B. A tunnel space 515B is defined above the battery module mounting area 505B by a set of center-mounted bars 520B, which correspond to the set of center-mounted bars 330D in FIG. 3D. Further shown in FIG. 5B is a BJB 525B that is configured to be connected to the various battery modules via both LC busbars 530B and HC busbars 535B. While not shown expressly in FIG. 5B, the LC busbars 530B and HC busbars 535B may be installed inside of the tunnel space 515B, which may then be sealed.

While FIGS. 5A-5B are directed to an example implementation of a "wired" LC communications interface (or LC busbars) between a BJB and respective battery modules inside of a tunnel space, other embodiments are directed to a wireless optical LC communications interface, as will be described below in more detail. As used herein, "optical" signals which may be transported using the wireless optical LC communications interface may include non-visible light signals (e.g., infrared, near-infrared, ultraviolet, etc.), visible light signals (e.g., light signals in the visible spectrum visible to the human eye), or any combination thereof. As will become clear from the below description, wireless optical LC communications interfaces may provide a number of advantages over wired LC communications interfaces as described above with respect to FIGS. 1-5B.

For example, a first problem occurs in context with electric vehicles is that wired connectors are, in general, high-failure items, and a modular battery system as described above with respect to FIGS. 1-5B may potentially have many more connectors than a non-modular battery system. Further, it may be difficult to design a "slide-in" system which would simultaneously mate the larger HC connectors 205 of the battery module 100 to corresponding electrical interfaces in the tunnel space 315A, while also mating the smaller, wired LC data port 210 as the battery module 100 is slid into place inside the battery module compartment. There are several reasons why this is difficult:

(1) Weight/Inertia: battery module is heavy, and may have considerable inertia as it is slid into place. The force of this moving mass could be enough to smash a small LC data port connector (e.g., such as the LC data port 210 and its corresponding mate in the tunnel space 315A) if it is not perfectly aligned.

2) Alignment Tolerance: The tolerances for the larger HC connectors 205 by contrast will be much larger, and could be designed to mate correctly with an initial misalignment of several millimeters. However, even a misalignment of several millimeters may be too much for the smaller LC data port 210 and its corresponding mate in the tunnel space 315A.

3) Insertion Depth: The larger HC connectors 205 can tolerate many millimeters of insertion tolerance. However, the smaller LC data port 210 will have much shorter pins, and therefore must be mated more precisely. In general, it is difficult to mate thicker HC connectors (e.g., such as the HC connectors 205) simultaneously with thinner and more fragile LC connectors such as THE LC data port 210.

In a further example, a second problem faced in a stacked battery system is that each battery module will be operating at a different voltage with respect to system ground. For example, if each battery module has 10 P-Groups (e.g., groups of batteries arranged in parallel to increase current and then connected in series with each other to increase voltage) of 4 volts each, then the first battery module will operate referenced to 0V (ground). The next serially connected battery module will operate referenced to 40V above ground, the next serially connected battery module at 80V, etc. So, it may be difficult to wire the communications signals for the battery modules together (e.g., the higher gauge LC communication wires would simply melt). This has been solved in a variety of ways on other battery systems, including with transformer (inductive) coupling, capacitive coupling, and also with optical coupling, using a component called an "opto-coupler", which is a pair of light emitting diodes (LEDs) and a pair of phototransistors molded into a plastic case. Each of these methods provides "galvanic isolation" between the modules, and allows communication across different voltage domains.

In at least one embodiment, by using an optical interface through a tunnel space between the battery modules and the BMC, both the first and second problems may be reduced and/or eliminated (e.g., eliminating a troublesome connector and all alignment issues around that connector, and providing the required galvanic isolation between the battery modules and also the system).

Figure 6:
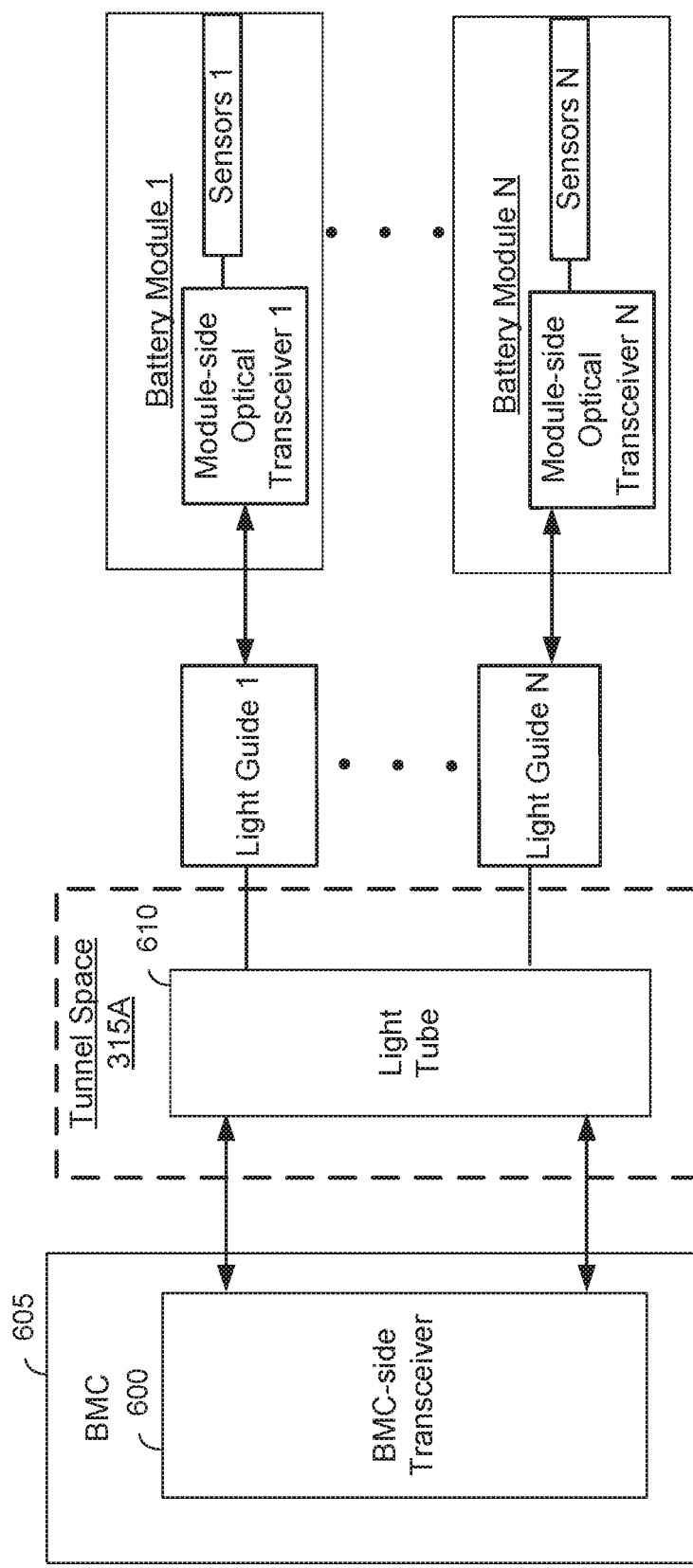
FIG. 6 illustrates a functional diagram that demonstrates how battery modules may connect to a BMC in accordance with an embodiment of the disclosure.

FIG. 6 illustrates a functional diagram that demonstrates how battery modules may connect to a BMC in accordance with an embodiment of the disclosure.

Referring to FIG. 6, a plurality of battery modules 1 ... N are each coupled to a module-side optical transceiver and a set of sensors (e.g., load balancing circuitry, temperature sensors, smoke sensors, etc.), denoted as module-side optical transceivers 1 ... N and sensors 1 ... N, respectively, in FIG. 6. The module-side optical transceiver of each battery module is communicatively coupled with at least one light guide inside a respective battery module compartment (e.g., beneath the tunnel space 315A), denoted as light guides 1 ... N. As will be explained below in more detail, the light guides 1 ... N may include housings (e.g., plastic covers) that secure the module-side optical transceivers 1 ... N onto the respective battery modules 1 ... N, and may further include light guides that extend downward into the battery module compartment area from a light tube. So, light guide 1 may be representative of multiple light guides that carry optical signals between the light tube and module-side optical transceiver 1, and so on. Each of the light guides interfaces 1 ... N is configured to transport data to a BMC-side transceiver 600, which is coupled to a BMC 605, over light tube 610 in the tunnel 315A. As noted above, the BMC 405 may be provisioned as part of the BJB in an example.

Figure 7:
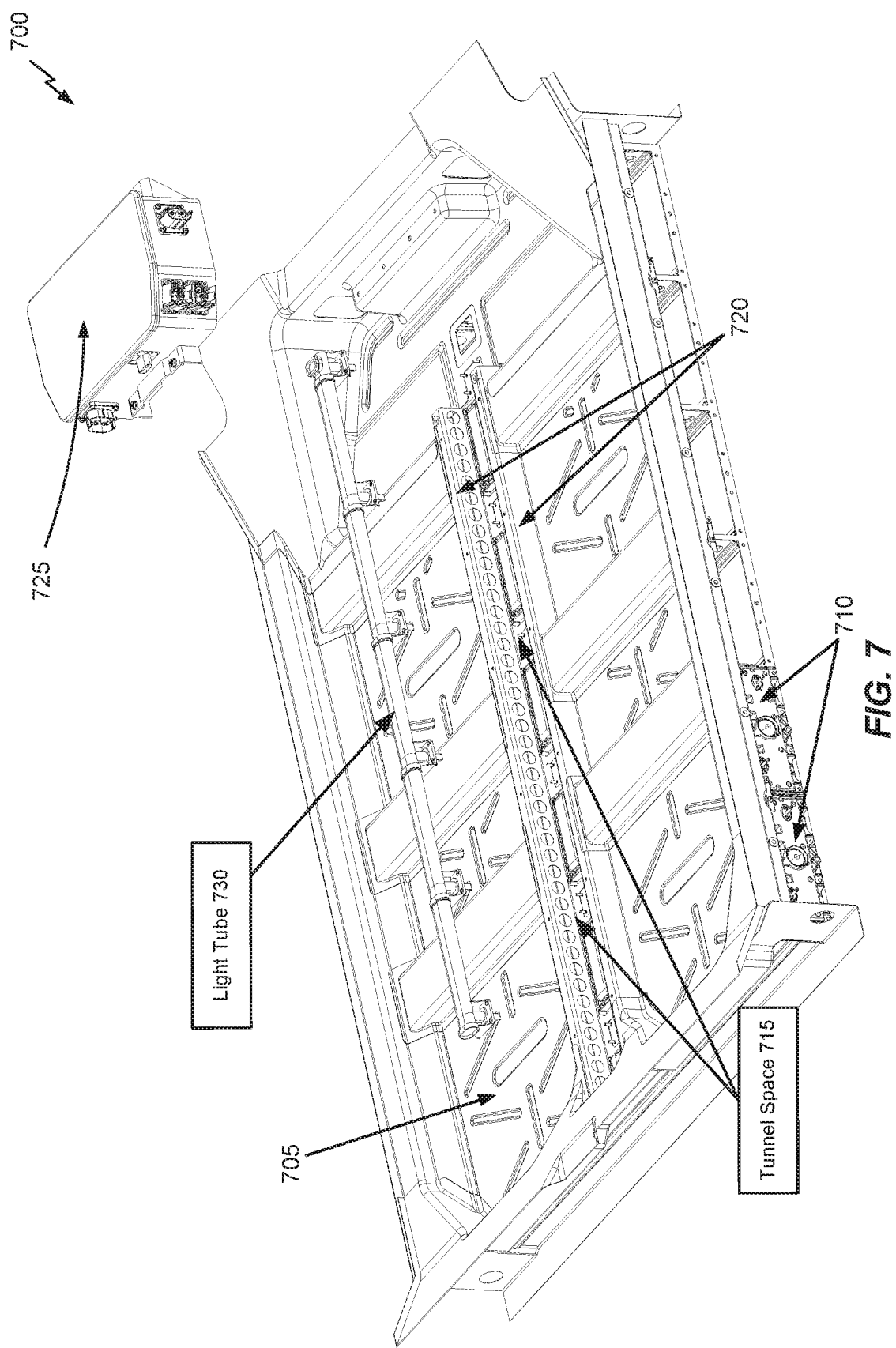
FIG. 7 illustrates an example of an electric vehicle including a battery module mounting area in accordance with an embodiment of the disclosure.

FIG. 7 illustrates an example of an electric vehicle 700 including a battery module mounting area 705 in accordance with an embodiment of the disclosure.

Referring to FIG. 7, the battery module mounting area 705 is configured similarly to the battery module mounting area 305A in FIGS. 3A-3D. Various battery modules 710 are depicted as inserted into the battery module mounting area 705, while other battery module compartments are shown as empty. A tunnel space 715 is defined above the battery module mounting area 705 by a set of center-mounted bars 720, which corresponds to the set of center-mounted bars 330D in FIG. 3D. Further shown in FIG. 7 is a BJB 725 which is configured to be connected to the various battery modules via an optical communications interface 730, or light tube. While the BJB 725 and light tube 730 are shown as floating above the battery housing components in FIG. 7, it will be appreciated that this is for convenience of illustration as the BJB 725 is installed adjacent to the tunnel space 715 and the light tube 730 is installed into the tunnel space 715.

Figure 8:
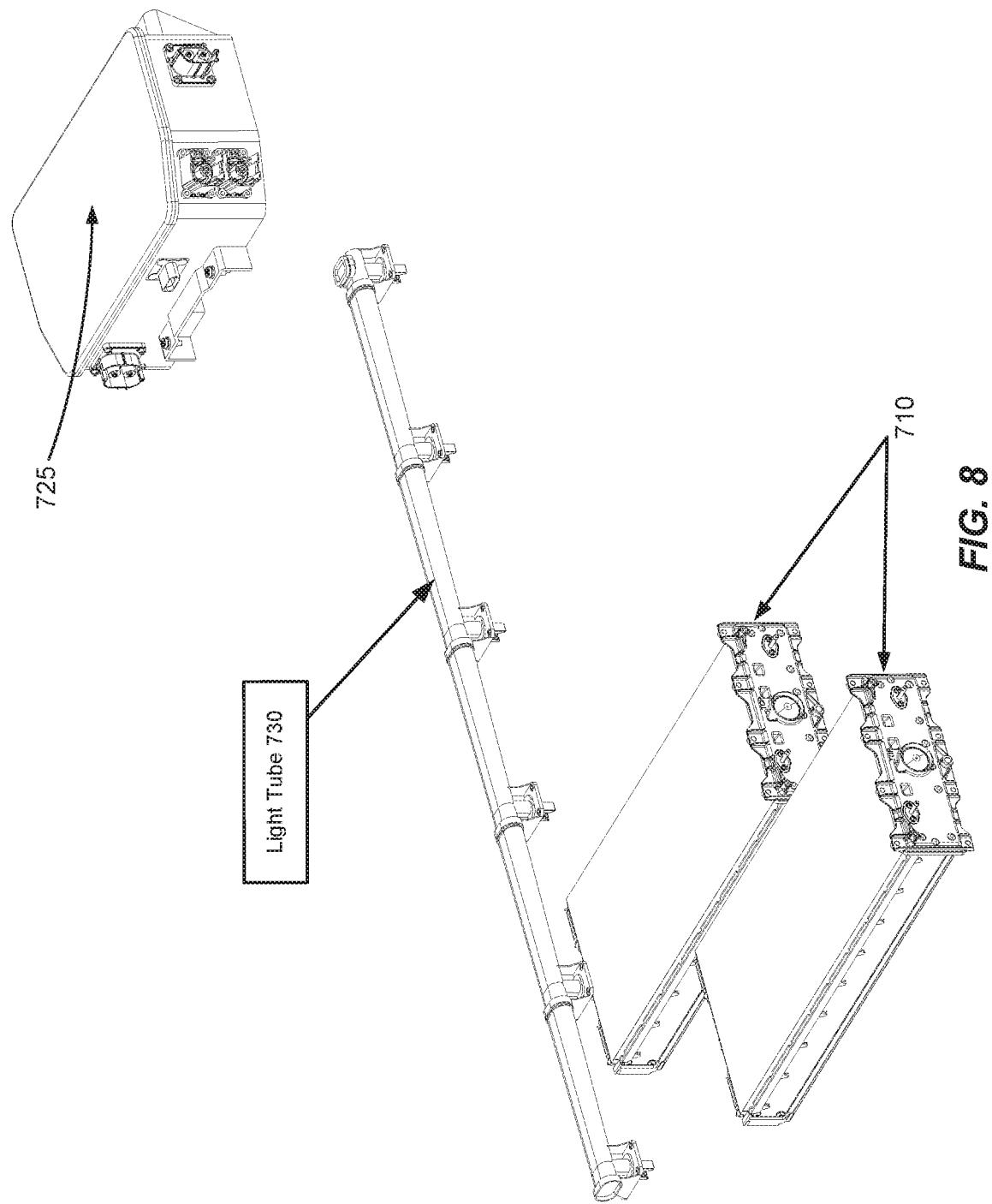
FIG. 8 illustrates a perspective of the electric vehicle that removes various components illustrated in FIG. 7.

FIG. 8 illustrates a perspective of the electric vehicle 700 that removes various components illustrated in FIG. 7. In particular, the battery modules 710, BJB 725 and light tube 730 are depicted in FIG. 8. The light tube 730 may comprise a plurality of light tube sections that are connected together.

Figure 9:
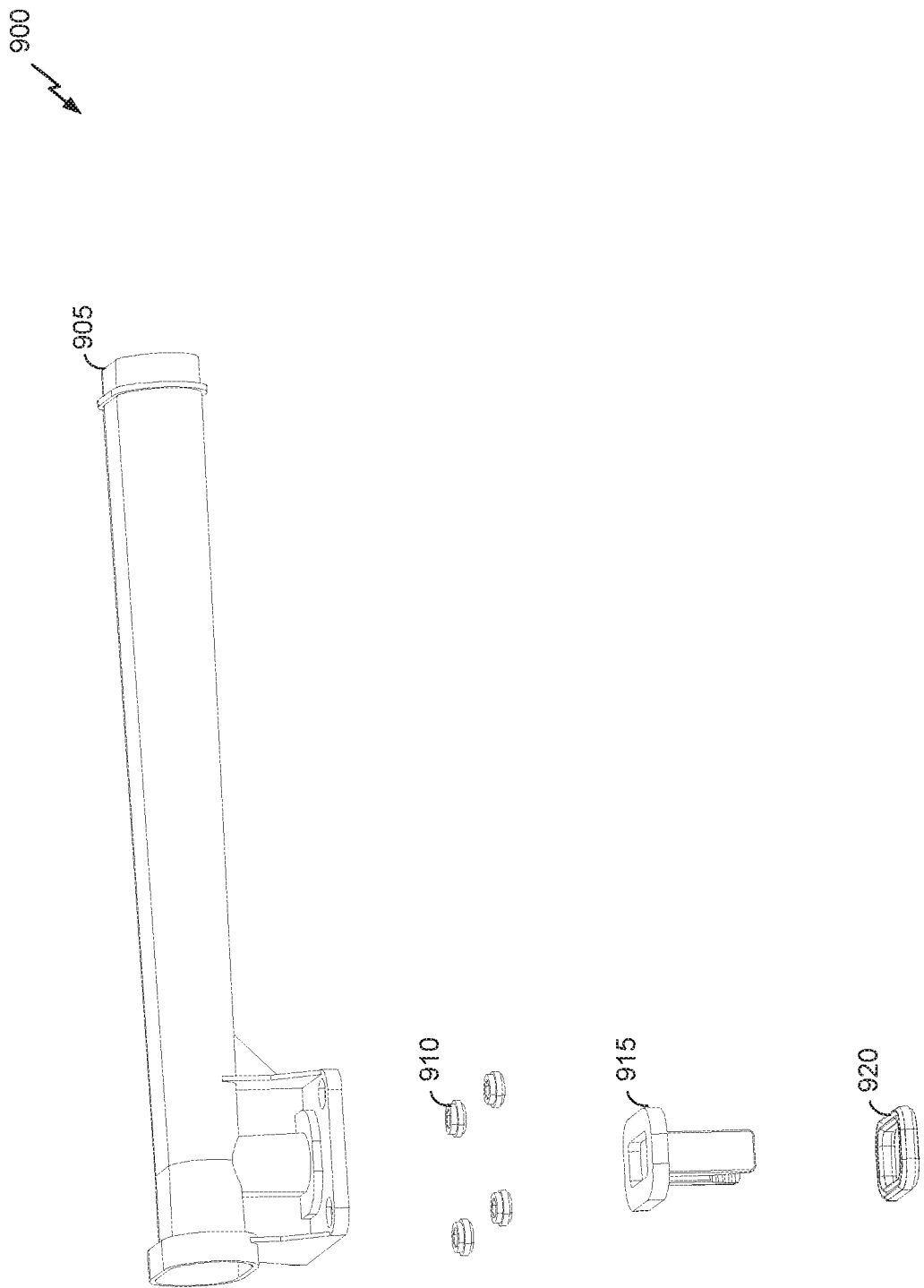
FIG. 9 illustrates a light tube section arrangement in accordance with an embodiment of the disclosure.

FIG. 9 illustrates a light tube section arrangement 900 in accordance with an embodiment of the disclosure. Referring to FIG. 9, the light tube section arrangement 900 includes a light tube section 905 (e.g., made from plastic), bushings 910 (e.g., made from metal), a light guide component 915 (e.g., made from plastic), and a sealing component 920.

Referring to FIG. 9, the light guide component may be configured to extend downwards beneath the tunnel space 715 into the battery module compartment areas. More specifically, the light guide component may include first and second light guides that extend into respective laterally adjacent battery module compartments. The first light guide is aligned with a first module-side optical transceiver of a first battery module in a first battery module compartment (or associated intervening light guide), while the second light guide is aligned with a second module-side optical transceiver of a second battery module in a second battery module compartment (or associated intervening light guide). Turning back to FIG. 3B, the light guide component may correspond to the pair of LC module-to-tunnel interfaces insertion into the hole 310B, in an example.

In an example, the sealing component 920 may be a transparent seal (e.g., clear plastic) that permits optical signals to be transported while blocking contaminants (e.g., dust, debris, smoke, etc.). In a specific example, the sealing component 920 may be configured to seal the hole 310B illustrated in FIG. B. Accordingly, components 905-920 may be connected together to form a sealed interface (e.g., protected from dust, etc.) to module-side optical transceivers in certain embodiments of the disclosure. In an example, the light guide component 915 may extend downwards beneath the tunnel space into proximity with and/or contact with a module-side optical transceiver, with the light guide component 915 functioning as an optical LC module-to-tunnel interface.

Figure 10:
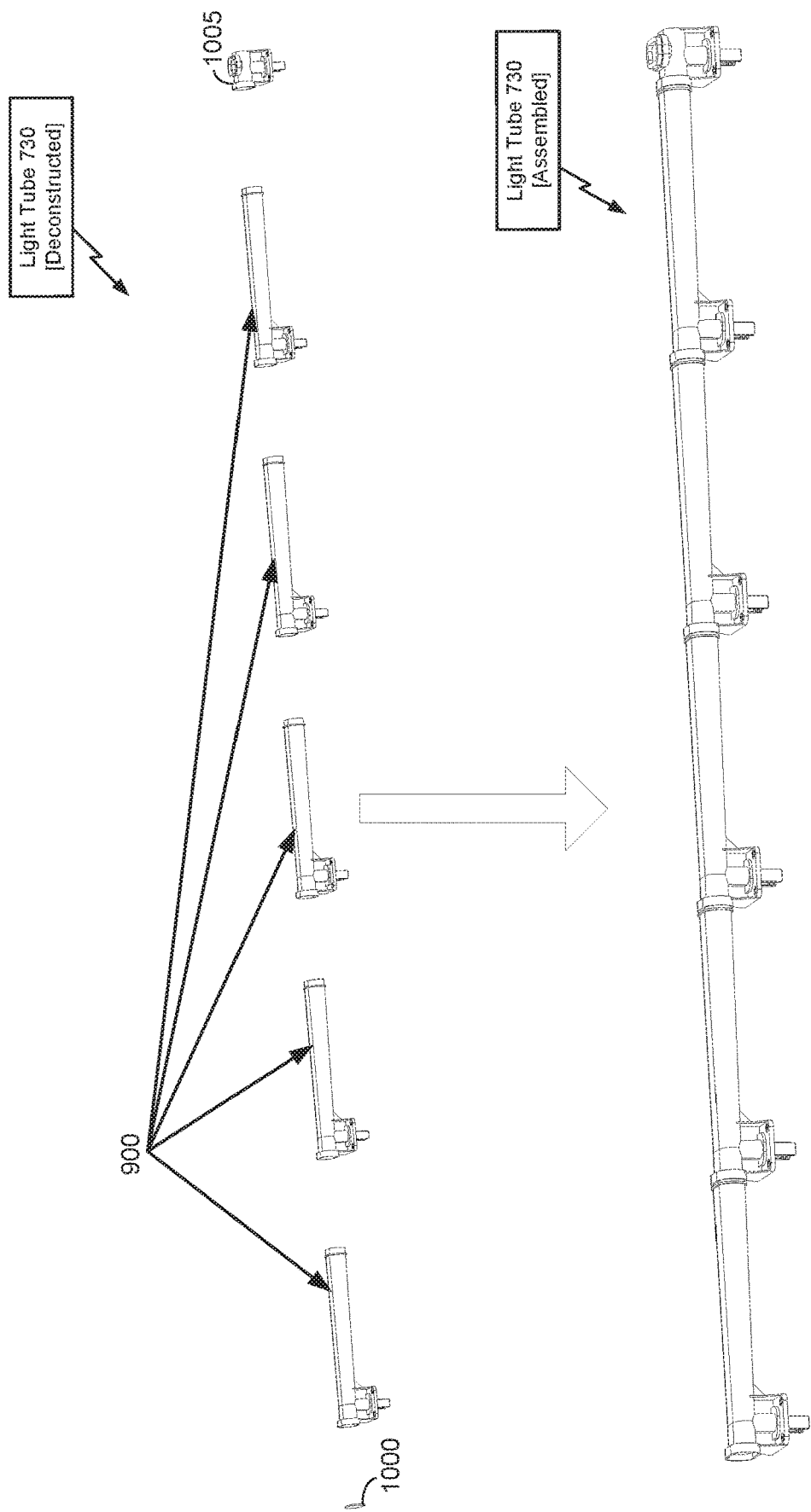
FIG. 10 illustrates deconstructed (or exploded) and assembled views of the light tube 730 in accordance with an embodiment of the disclosure.

FIG. 10 illustrates deconstructed (or exploded) and assembled views of the light tube 730 in accordance with an embodiment of the disclosure. In the deconstructed (or exploded) view, five light tube sections 900 are shown, along with a cover 1000 (e.g., a seal made from plastic) and an optical transceiver interface section 1005 (e.g., near a BMC-side optical transceiver at the BJB). In an example, the optical transceiver interface section 1005 may be a "shortened" light tube section 900 that connects to the LC module-to-tunnel interfaces for the battery modules closest to the BMB-side optical transceiver and/or BJB. So, the optical transceiver interface section 1005 may include a shortened light tube part 905, along with components 910-920 as in the other light tube sections 900. The assembled view shows the various components from the deconstructed (or exploded) view connected together to form the light tube 730.

Figure 11:
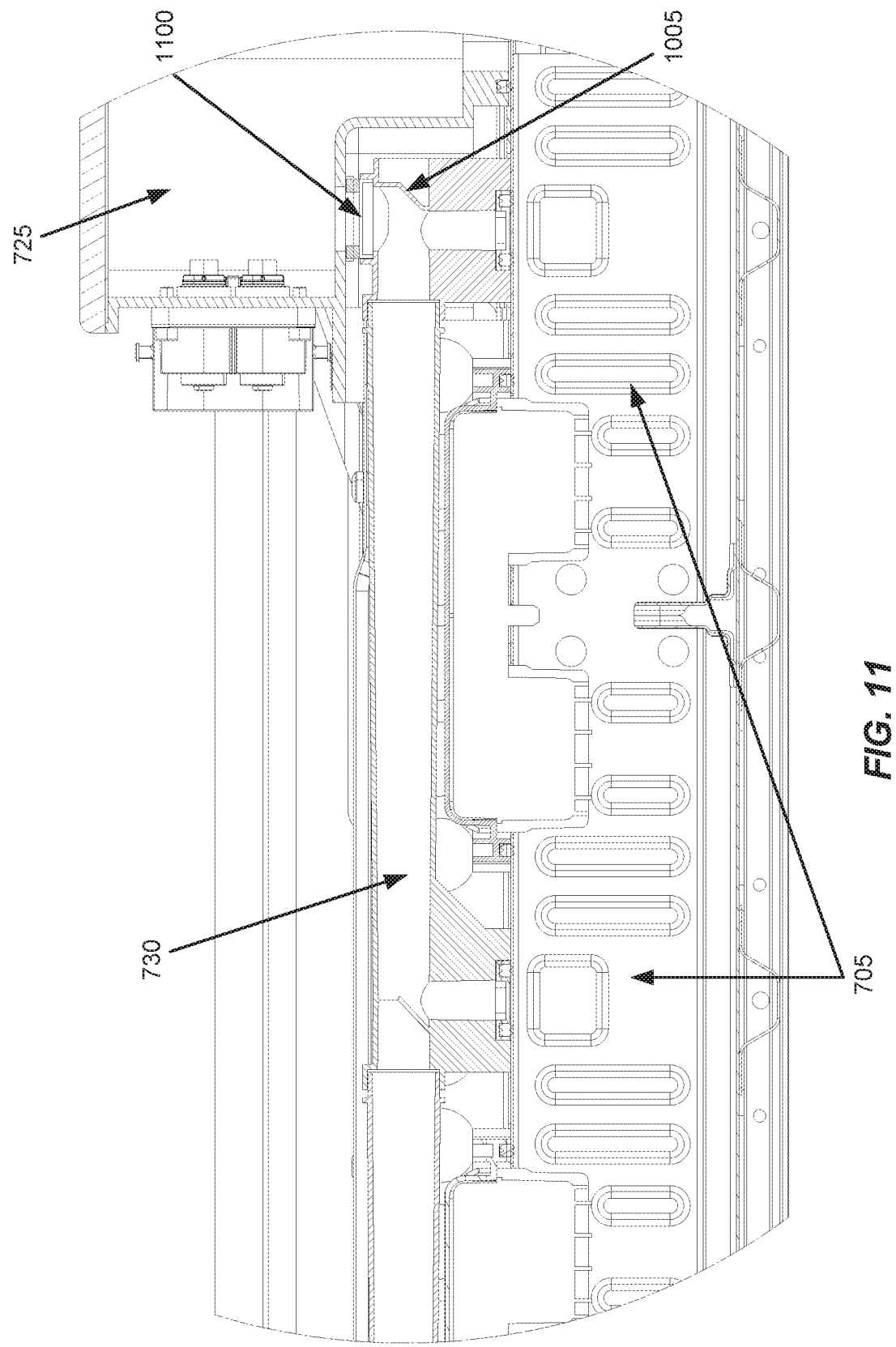
FIG. 11 illustrates a side-perspective of the electric vehicle that depicts a connection between a light tube and a battery junction box (BJB) above a battery module mounting area in accordance with an embodiment of the disclosure.

FIG. 11 illustrates a side-perspective of the electric vehicle 700 that depicts a connection between the light tube 730 and the BJB 725 above the battery module mounting area 705 in accordance with an embodiment of the disclosure. A BMC-side optical transceiver 1100 may be located at the end of the light tube 730 inside of and/or in proximity to the optical transceiver interface section 1005 of the light tube 730.

Figure 12:
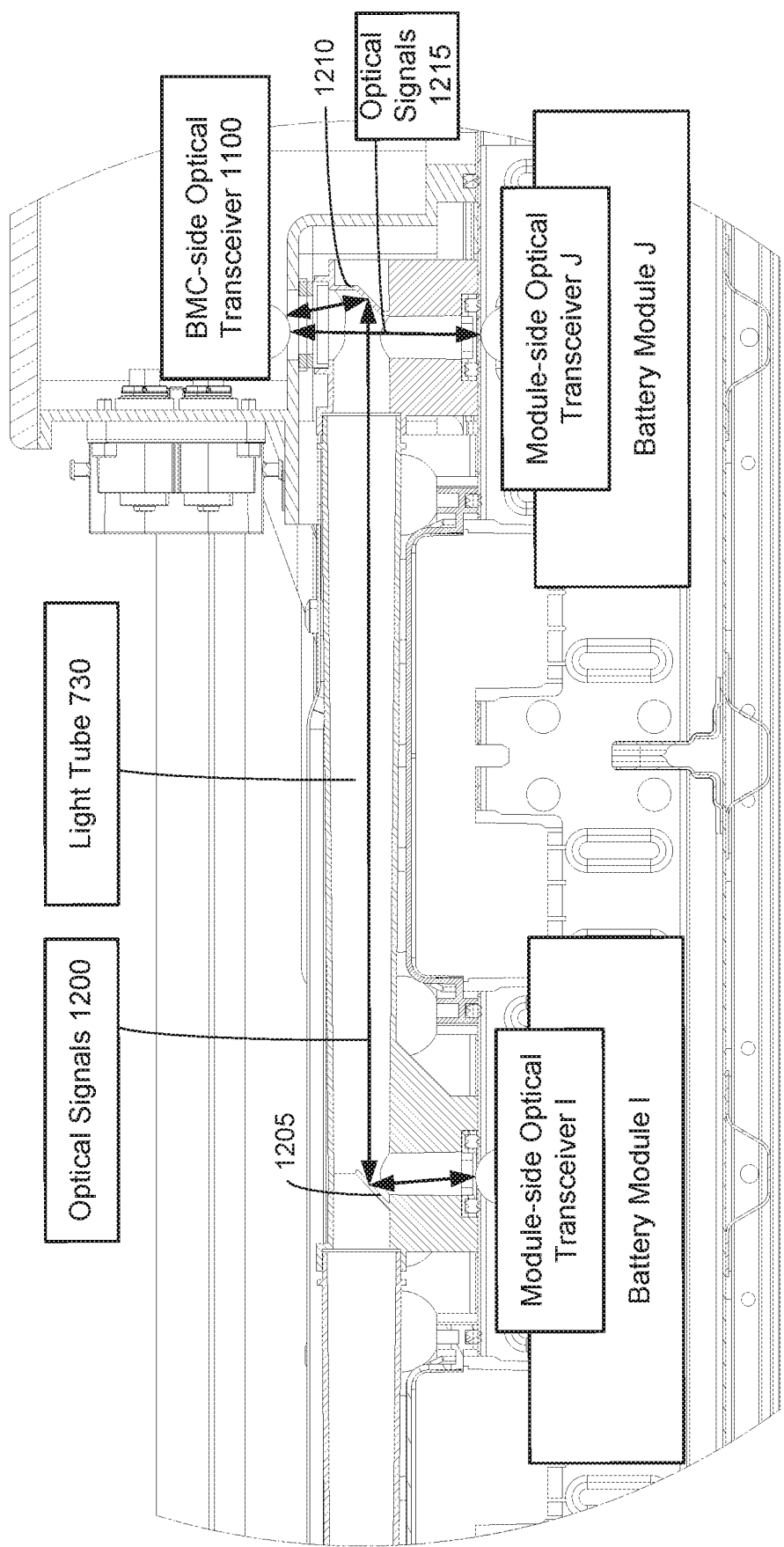
FIG. 12 illustrates a side-perspective of the electric vehicle from FIG. 11 overlaid with annotation that explains how optical signals are transported from battery modules to a BMC-side optical transceiver through a light tube in accordance with an embodiment of the disclosure.

FIG. 12 illustrates the side-perspective of the electric vehicle 700 from FIG. 11 overlaid with annotation that explains how optical signals (e.g., beams of light) are transported from battery modules I and J to the BMC-side optical transceiver 1100 through the light tube 730 in accordance with an embodiment of the disclosure. In FIG. 12, assume that battery modules are arranged in a battery housing as described above with respect to battery modules A . . . J in FIG. 3A, and that each battery module includes an integrated module-side optical transceiver. Accordingly, battery module I includes module-side optical transceiver I, and battery module J includes module-side optical transceiver J.

Referring to FIG. 12, with respect to battery module I in a module-to-BMC direction, the module-side optical transceiver I transmits (e.g., emits or blasts) optical signals 1200 at a given blasting angle (e.g., approximately 15°) towards a deflection element 1205 (e.g., a mirror), which redirects the optical signals 1200 towards a deflection element 1210 (e.g., a mirror), which in turn redirects the optical signals 1200 towards the BMC-side optical transceiver 1100. With respect to battery module I in a BMC-to-module direction, the BMC-side optical transceiver 1100 transmits (e.g., emits or blasts) optical signals 1200 at a given blasting angle (e.g., approximately 15°) towards the deflection element 1210 (e.g., a mirror), which redirects the optical signals 1200 towards the deflection element 1205 (e.g., a mirror), which in turn redirects the optical signals 1200 towards the module-side optical transceiver I.

Referring to FIG. 12, with respect to battery module J in a module-to-BMC direction, the module-side optical transceiver J has direct line-of-sight (LOS) to the BMC-side optical transceiver 1100. Hence, deflection elements are not needed to direct optical signals 1215 from battery module J to the BMC-side optical transceiver 1100 (and vice versa). Accordingly, the module-side optical transceiver J transmits (e.g., emits or blasts) optical signals 1215 at a given blasting angle (e.g., approximately 15°) towards the BMC-side optical transceiver 1100. With respect to battery module J in a BMC-to-module direction, the BMC-side optical transceiver 1100 transmits (e.g., emits or blasts) optical signals 1200 at a given blasting angle (e.g., approximately 15°) towards the module-side optical transceiver J.

The module-side optical transceivers may be attached to respective battery modules in a variety of ways, as will be described below with respect to FIGS. 13 through 22.

Figure 13:
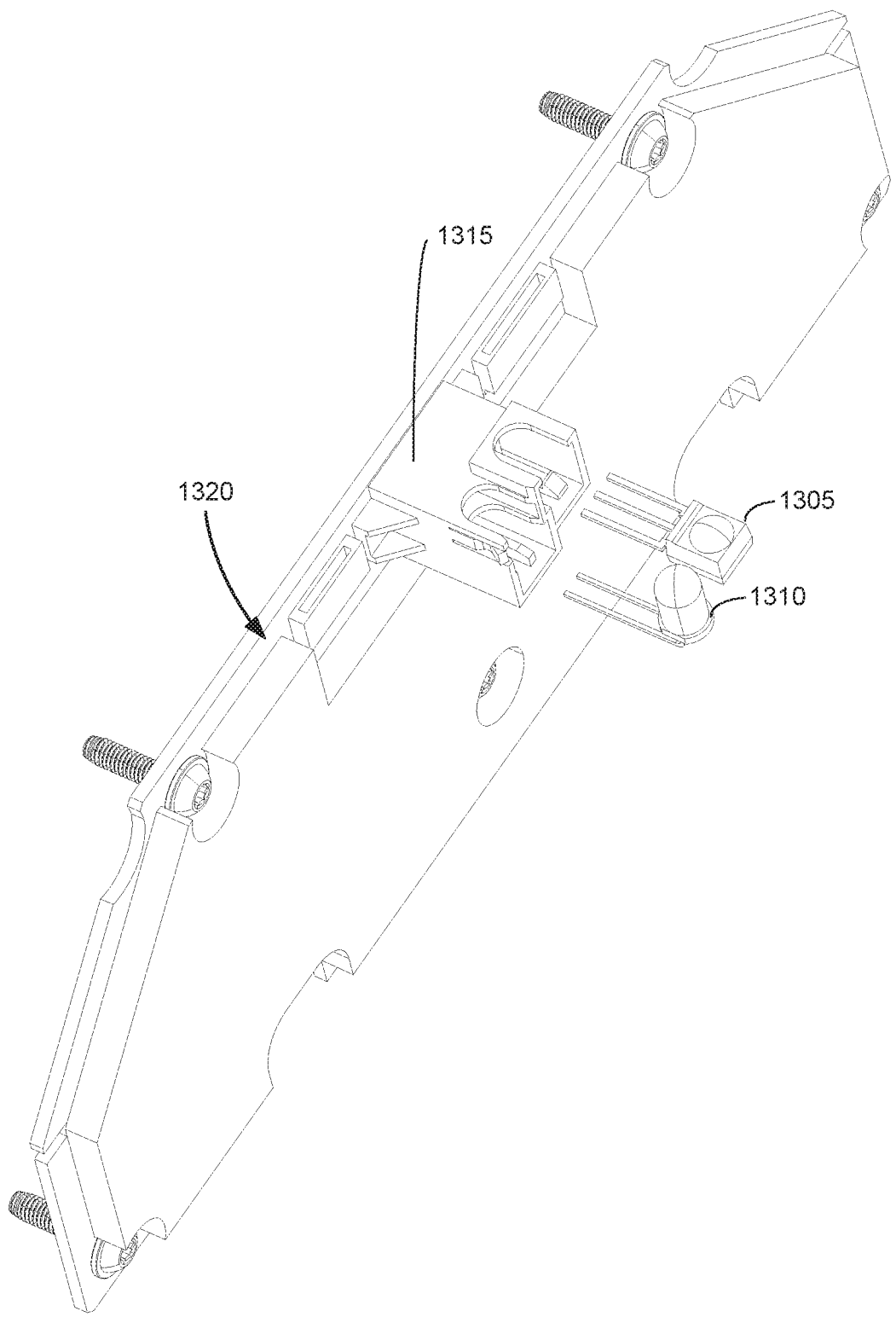
FIGS. 13-14 illustrate different perspectives of a module-side optical transceiver configuration in accordance with a first embodiment of the disclosure.
Figure 14:
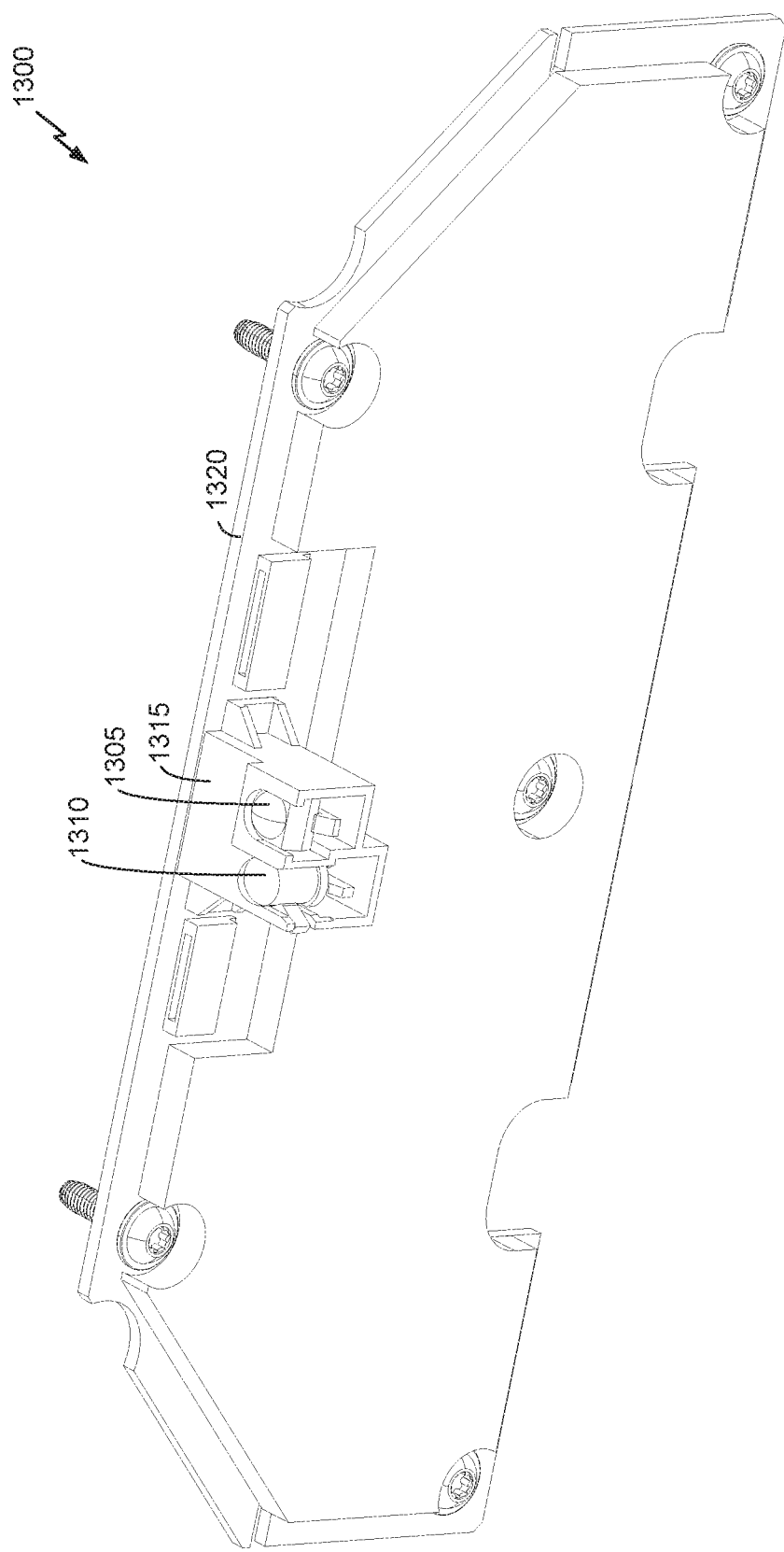

FIGS. 13-14 illustrate different perspectives of a module-side optical transceiver configuration 1300 in accordance with a first embodiment of the disclosure. In FIG. FIGS. 13-14, the module-side optical transceiver configuration 1300 includes an IR receiver 1305 and an IR transmitter 1310, which collectively comprise a module-side optical transceiver. The IR receiver 1305 and IR transmitter 1310 are inserted into a housing 1315 (e.g., made from plastic), which may in turn be secured to an insertion-side endplate 1320 of a battery module. For example, the housing 1315 may be secured to a region corresponding to the LC data port 210 shown in FIG. 2, with the IR receiver 1305 and IR transmitter 1310 configured to function as an optical-specific version of the LC data port 210.

Figure 15:
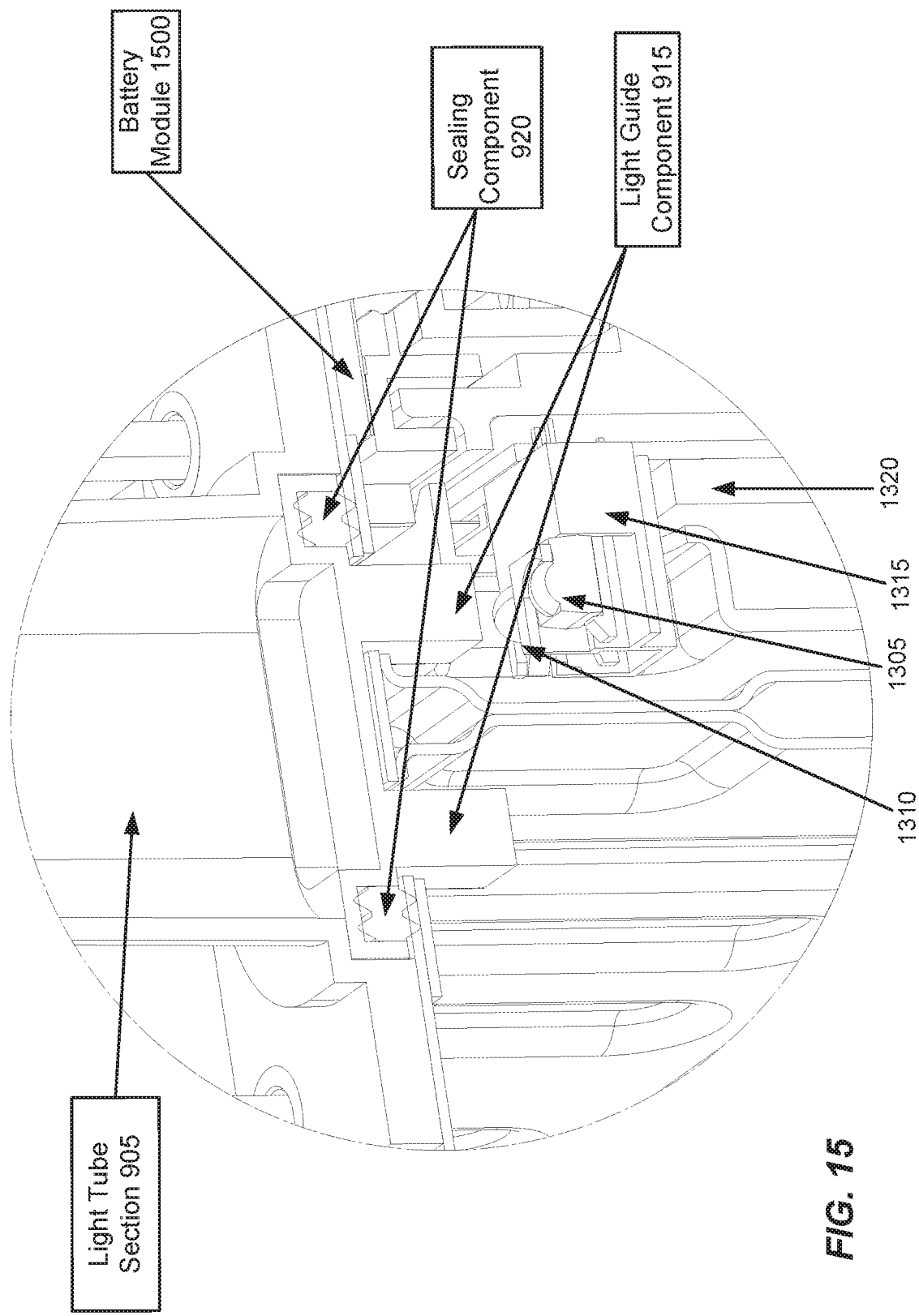
FIG. 15 illustrates a perspective depicting the module-side optical transceiver configuration of FIGS. 13-14 upon insertion of an associated battery module into a battery module compartment in accordance with an embodiment of the disclosure.

FIG. 15 illustrates a perspective depicting the module-side optical transceiver configuration 1300 upon insertion of an associated battery module 1500 into a battery module compartment in accordance with an embodiment of the disclosure. The laterally adjacent battery module compartment is shown as empty in FIG. 15 (i.e., no battery module yet inserted).

In FIG. 15, upon insertion of the battery module 1500 into its respective battery module compartment, the IR receiver 1305 and IR transmitter 1310 are aligned with an associated light guide of the light guide component 915. So, the blasting angle of the IR transmitter 1310 will beam optical signals into the light tube section 905, and optical signals from the BMC-side optical transceiver are transported out of the associated light guide of the light guide component 915 and detected by the IR receiver 1305. In the embodiment of FIG. 15, there is an air gap between the light guide component 915 and the IR receiver 1305 and IR transmitter 1310, and dust may thereby result (e.g., which over time may degrade the quality of optical signals being exchanged between the battery module 1500 and the BMC).

Figure 16:
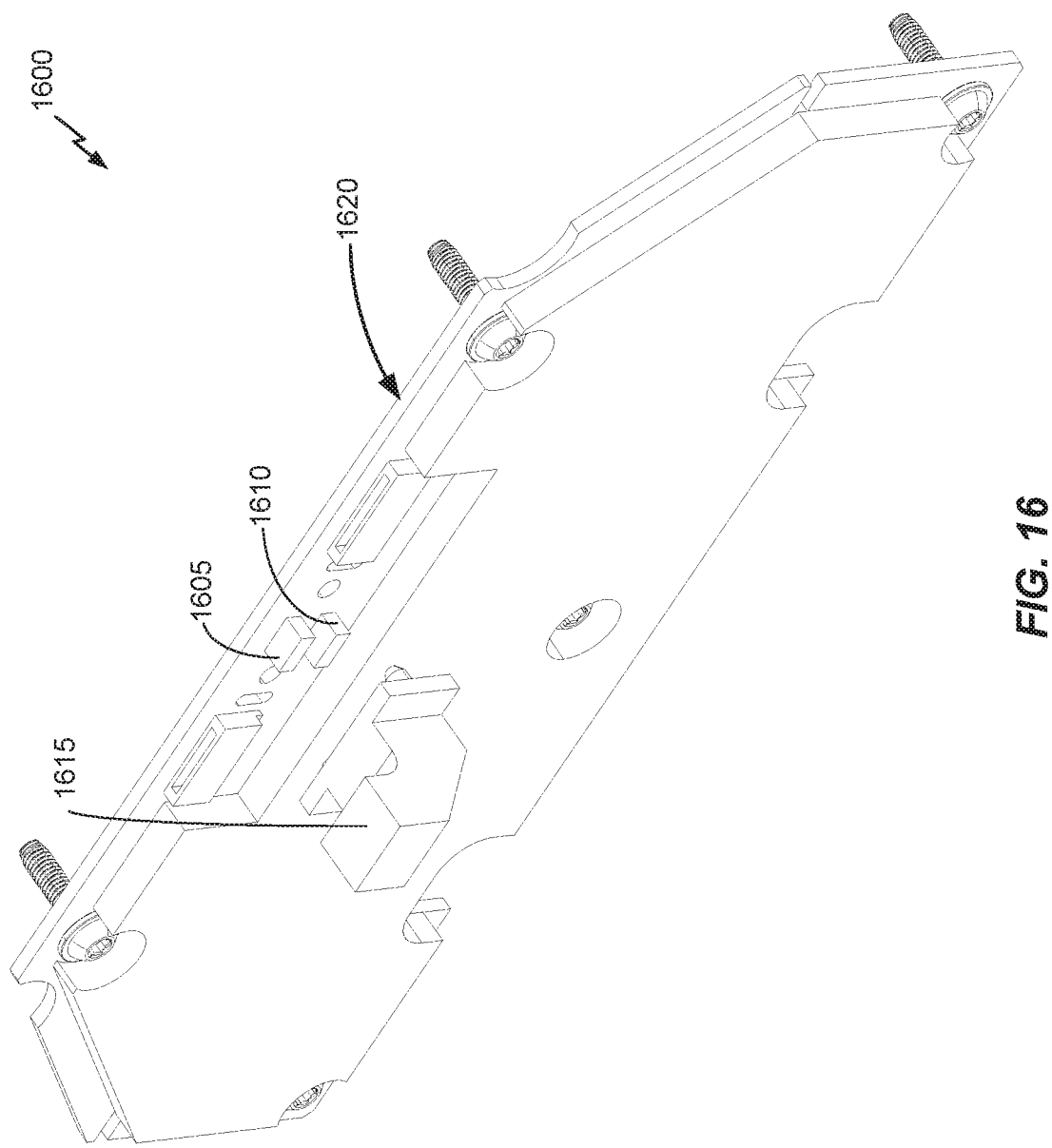
FIGS. 16-17 illustrate different perspectives of a module-side optical transceiver configuration in accordance with a second embodiment of the disclosure.
Figure 17:
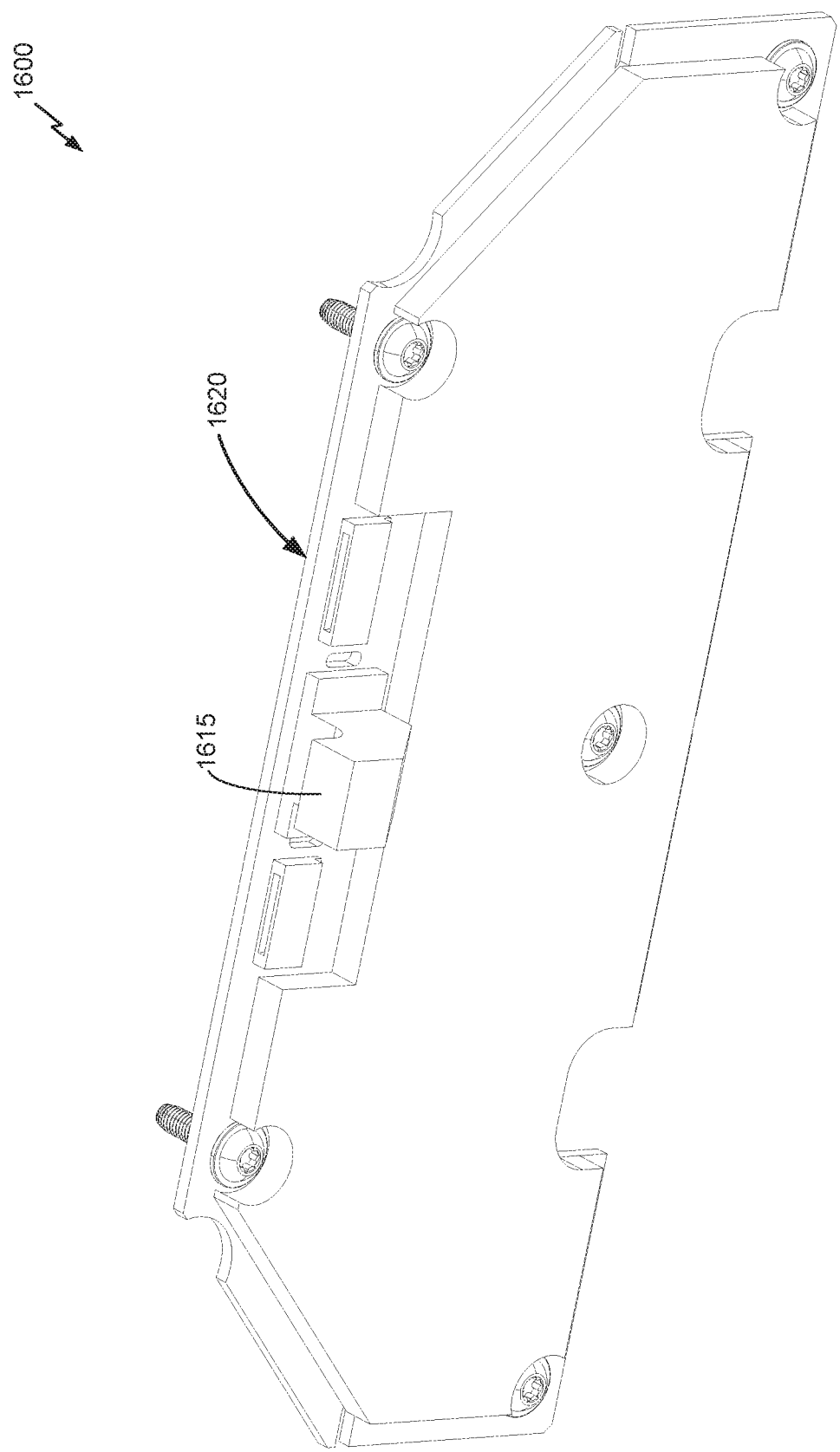

FIGS. 16-17 illustrate different perspectives of a module-side optical transceiver configuration 1600 in accordance with a second embodiment of the disclosure. In FIGS. 16-17, the module-side optical transceiver configuration 1600 includes an IR receiver 1605 and an IR transmitter 1610, which collectively comprise a module-side optical transceiver. The IR receiver 1605 and IR transmitter 1610 are inserted into a light guide 1615 (e.g., made from plastic), which also functions as a housing for the module-side optical transceiver. The light guide 1615 is shown as placed over the IR receiver 1605 and IR transmitter 1610 in FIG. 17, such that the IR receiver 1605 and IR transmitter 1610 are not visible in FIG. 17. The light guide 1615 may be secured to an insertion-side endplate 1620 of a battery module. For example, the light guide 1615 may be secured to a region corresponding to the LC data port 210 shown in FIG. 2, with the IR receiver 1605 and IR transmitter 1610 configured to function as an optical-specific version of the LC data port 210.

Figure 18:
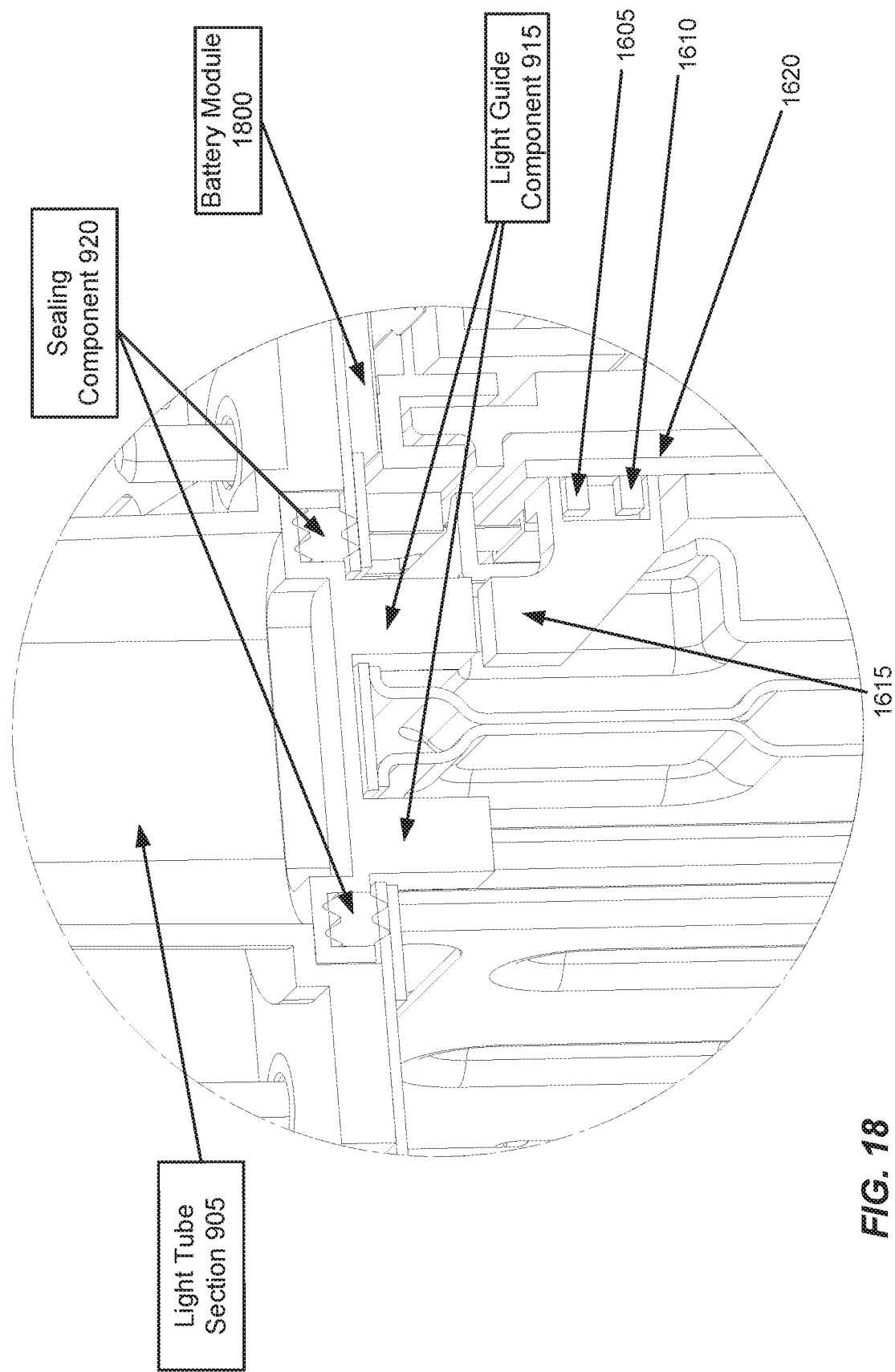
FIG. 18 illustrates a perspective depicting the module-side optical transceiver configuration of FIGS. 16-17 upon insertion of an associated battery module into a battery module compartment in accordance with an embodiment of the disclosure.

FIG. 18 illustrates a perspective depicting the module-side optical transceiver configuration 1600 upon insertion of an associated battery module 1800 into a battery module compartment in accordance with an embodiment of the disclosure. The laterally adjacent battery module compartment is shown as empty in FIG. 18 (i.e., no battery module yet inserted).

In FIG. 18, upon insertion of the battery module 1800 into its respective battery module compartment, the light guide 1615 is aligned with an associated light guide of the light guide component 915. So, the optical signals are blasted out of IR transmitter 1610 and then guided by the light guide 1615 towards an associated light guide of the light guide component 915. Also, optical signals from the BMC-side optical transceiver are transported out of the associated light guide of the light guide component 915 towards the light guide 1615, and then detected by the IR receiver 1605. In the embodiment of FIG. 18, there is an air gap between the light guide component 915 and the light guide 1615, and dust may thereby result (e.g., which over time may degree the quality of optical signals being exchanged between the battery module 1800 and the BMC).

In contrast to FIGS. 13-18, FIGS. 19-22 relate to an embodiment whereby an exposed air gap between the light tube section 900 and a corresponding module-side optical transceiver is reduced or eliminated, which limits the amount of dust that may develop near the optical communications components in accordance with an embodiment of the disclosure.

Figure 19:
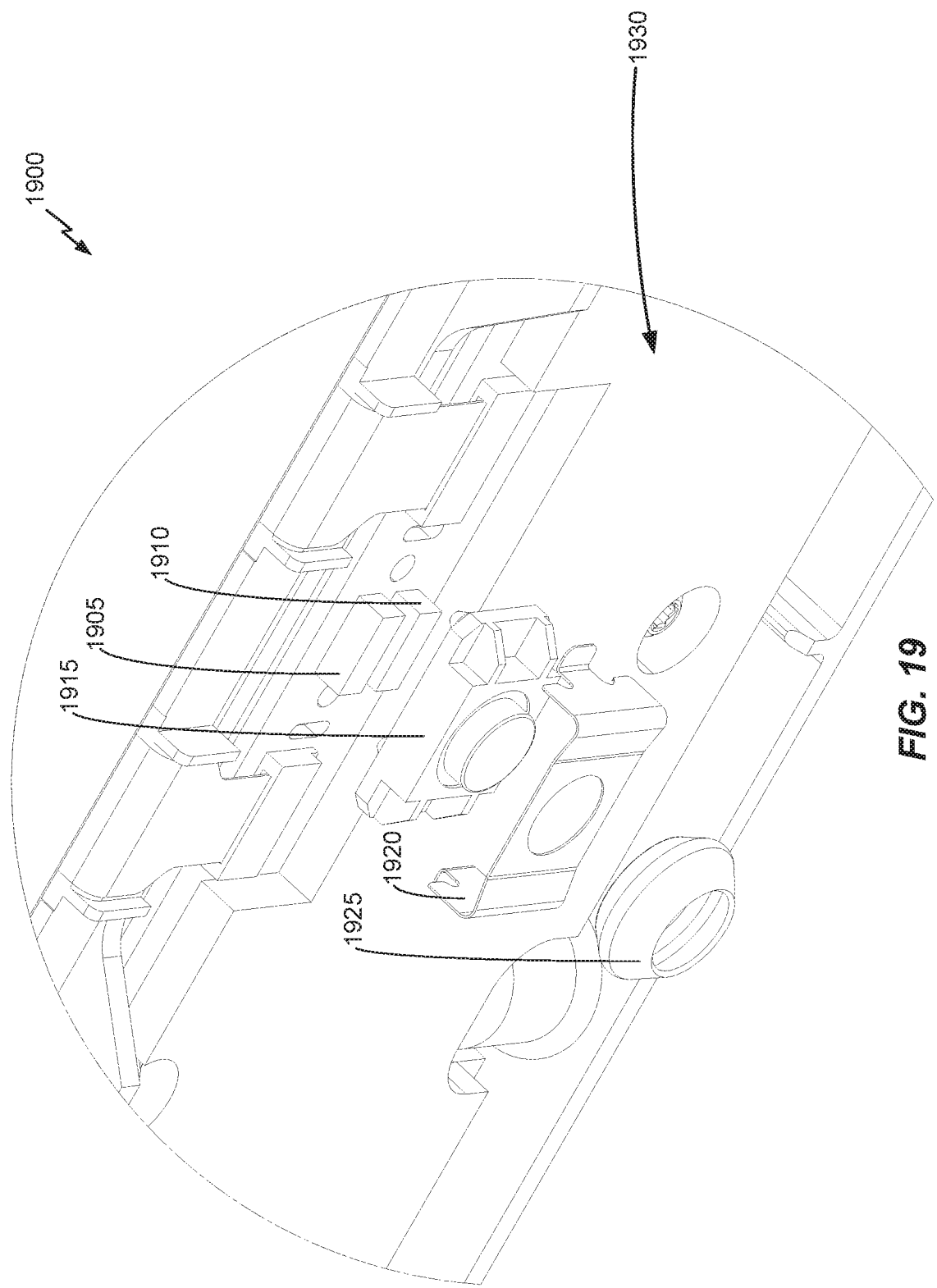
FIGS. 19-22 relate to an embodiment whereby an exposed air gap between a light tube section and a corresponding module-side optical transceiver is reduced or eliminated, which limits the amount of dust that may develop near the optical communications components in accordance with an embodiment of the disclosure.
Figure 20:
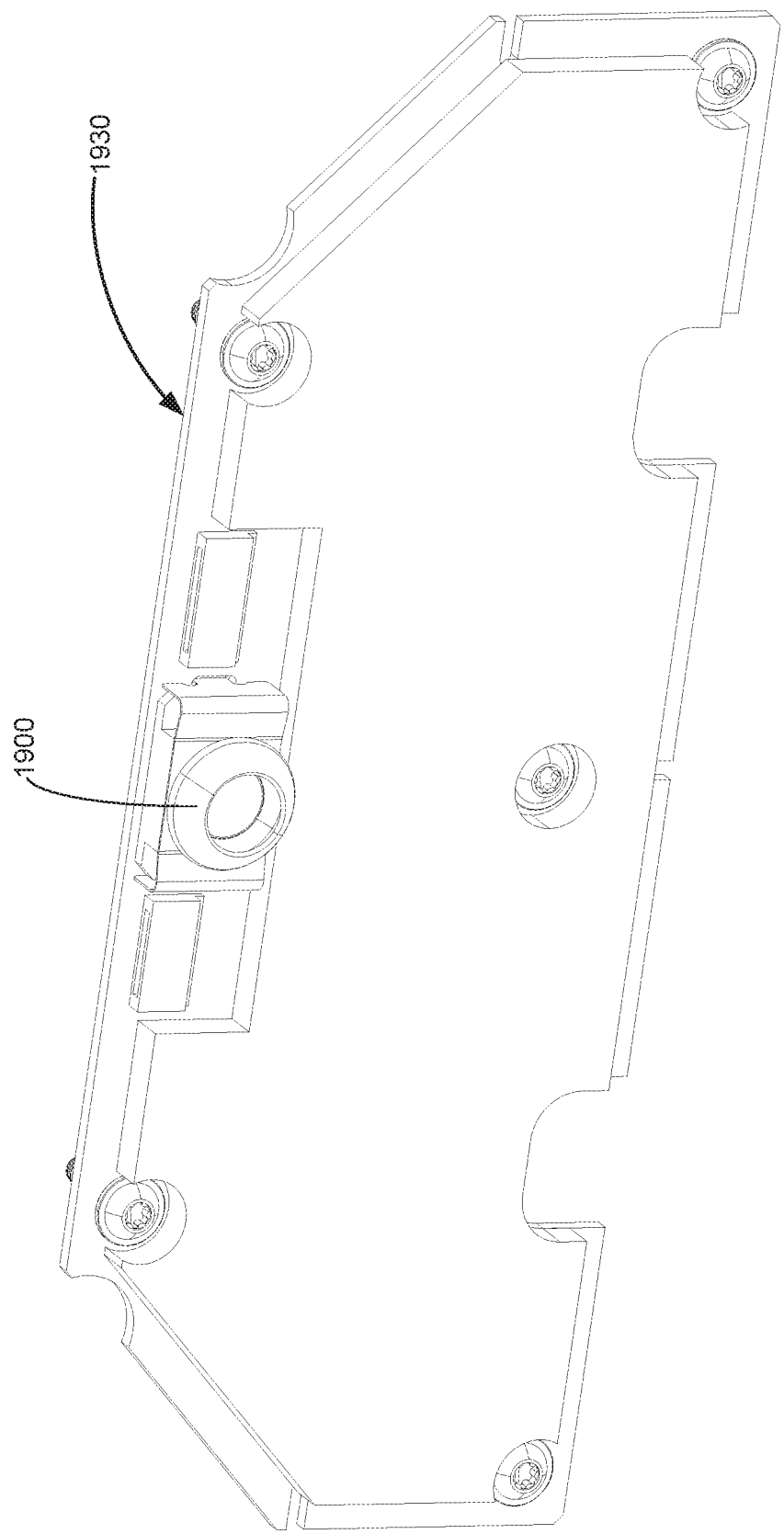
Figure 21:
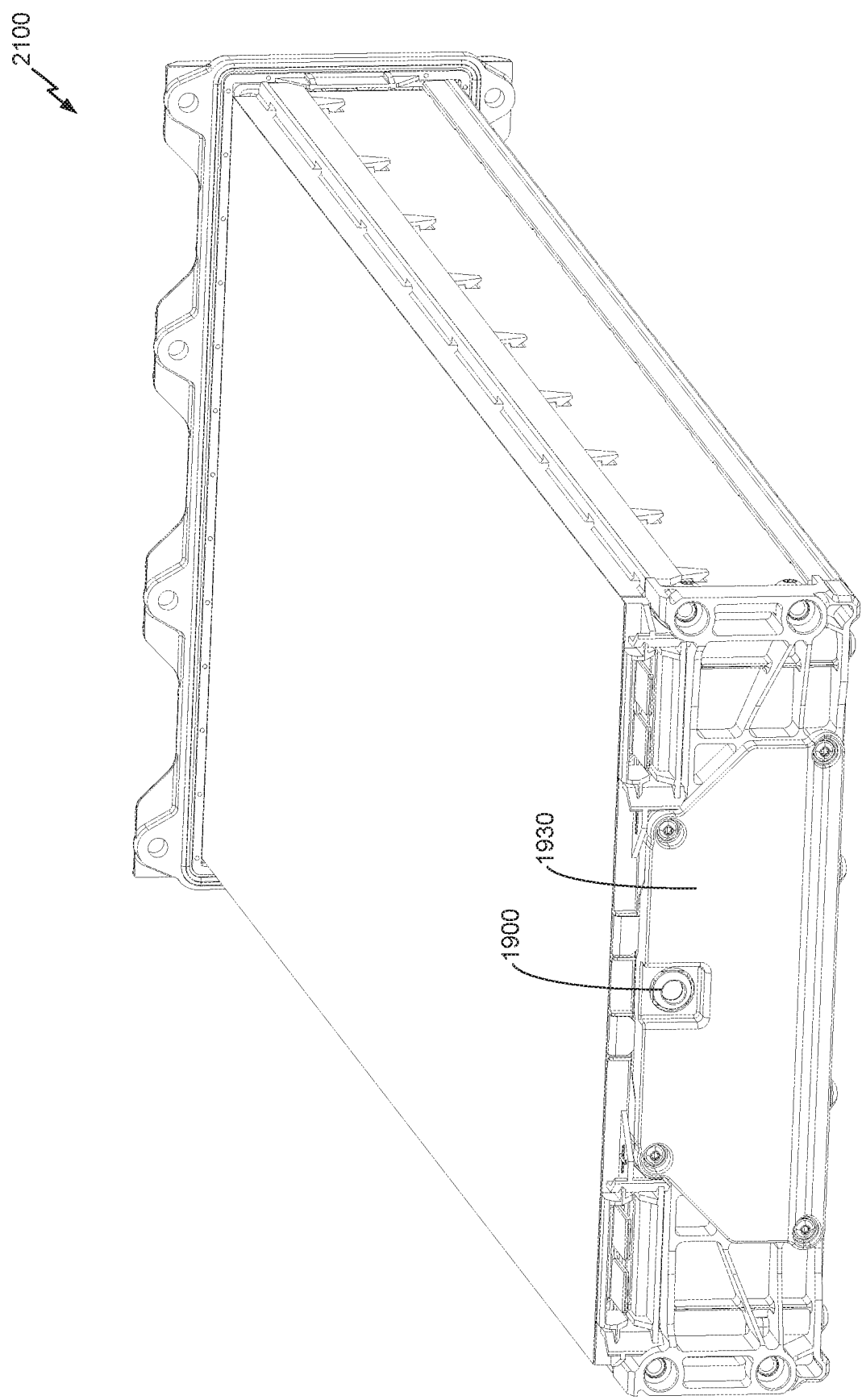

FIGS. 19-20 illustrate different perspectives of a module-side optical transceiver configuration 1900 in accordance with a third embodiment of the disclosure. In FIGS. 19-20, the module-side optical transceiver configuration 1900 includes an IR receiver 1905 and an IR transmitter 1910, which collectively comprise a module-side optical transceiver. The IR receiver 1905 and IR transmitter 1910 are covered by a light guide 1915 (e.g., made from plastic), which also functions as a housing for the module-side optical transceiver. The light guide 1915 is in turn covered by a clamp 1920 (e.g., made from metal), which is in turn covered by a sealing component 1925 (e.g., a soft, foamy material). As will be described below in more detail, the sealing component 1925 may be pressed against a light guide to ensure an end-to-end sealed interface (without an air gap) between the light guide component 915 and the module-side optical transceiver. In FIG. 20, the components 1915-1925 are placed over the module-side optical transceiver at 1900. The components 1905-1925 may be secured to an insertion-side endplate 1930 of a battery module. For example, the components 1905-1925 may be secured to a region corresponding to the LC data port 210 shown in FIG. 2, with the IR receiver 1905 and IR transmitter 1910 configured to function as an optical-specific version of the LC data port 210. Accordingly, FIG. 21 illustrates a more detailed battery perspective that is somewhat similar to FIG. 2 except the "wired" LC data port 210 is swapped out for the module-side optical transceiver configuration 1900.

Figure 22:
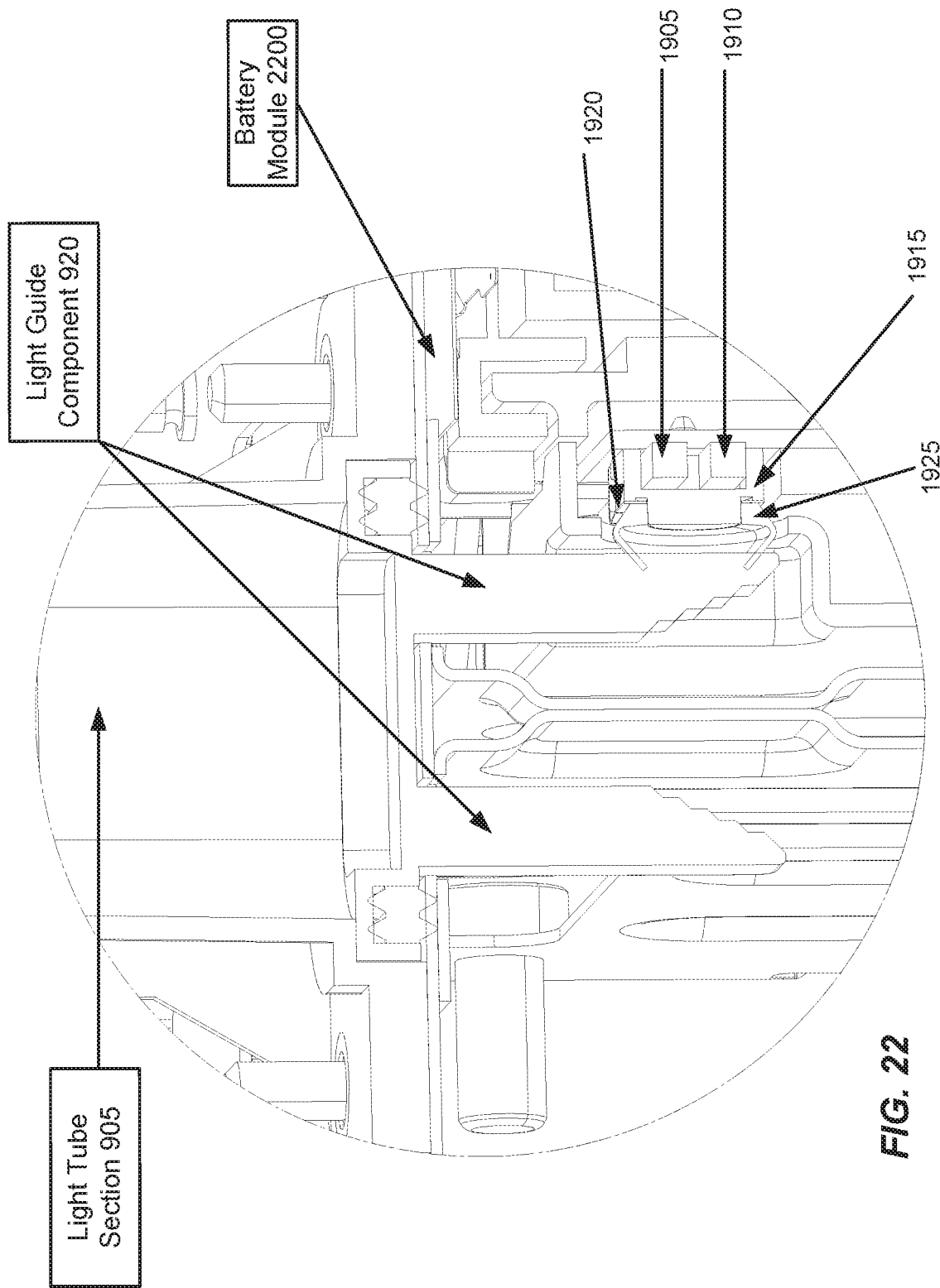

FIG. 22 illustrates a perspective depicting the module-side optical transceiver configuration 1900 upon insertion of an associated battery module 2200 into a battery module compartment in accordance with an embodiment of the disclosure. The laterally adjacent battery module compartment is shown as empty in FIG. 22 (i.e., no battery module yet inserted).

In FIG. 22, upon insertion of the battery module 2200 into its respective battery module compartment, the sealing component 1925 is pressed against an associated light guide of the light guide component 915. So, the optical signals are blasted out of IR transmitter 1810 and then guided by the light guide 1915 directly into an associated light guide of the light guide component 915 without having to pass through an exposed air gap. Likewise, optical signals from the BMC-side optical transceiver are transported out of the associated light guide of the light guide component 915 directly into the light guide 1915 without having to pass through an exposed air gap, and then detected by the IR receiver 1605. By reducing or eliminating the propagation of optical signals through an exposed air gap, the impact of dust may be mitigated.

While the embodiments described above with respect to FIGS. 6-22 rely upon optical communications interfaces that include a light tube and/or deflection elements (e.g., mirrors) deployed inside of the tunnel space 315A, other embodiments of the disclosure are directed to a cable harness implementation, as described below with respect to FIGS. 23-24.

Figure 23:
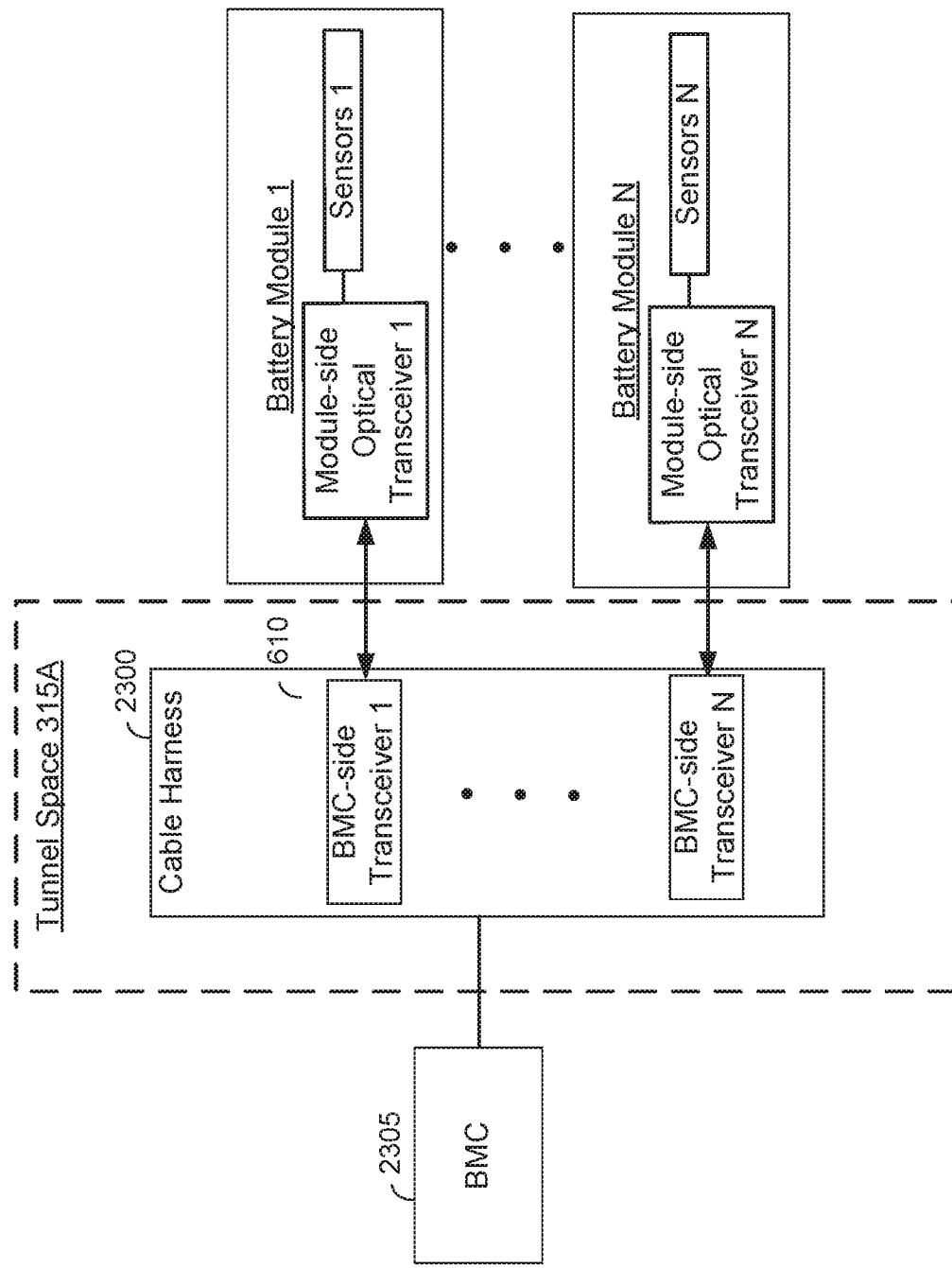
FIG. 23 illustrates a functional diagram that demonstrates how battery modules may connect to a BMC using a cable harness in accordance with an embodiment of the disclosure.

FIG. 23 illustrates a functional diagram that demonstrates how battery modules may connect to a BMC using a cable harness in accordance with an embodiment of the disclosure.

Referring to FIG. 23, a plurality of battery modules 1 . . . N are each coupled to a module-side optical transceiver and a set of sensors (e.g., load balancing circuitry, temperature sensors, smoke sensors, etc.), denoted as module-side optical transceivers 1 . . . N and sensors 1 . . . N, respectively, in FIG. 23. A cable harness 2300 includes a plurality of data communication cables (e.g., higher gauge communication cables that are bundled together) that are coupled to a BMC 2305. The cable harness 2300 is arranged inside of the tunnel space 2300 between the BMC 2305 and the plurality of battery modules 1 . . . N. Moreover, the cable harness 2300 is coupled to a plurality of BMC-side optical transceivers 1 . . . N inside of the tunnel space. More specifically, the cable harness 2300 may be coupled to a plurality of printed circuit (PC) boards that are in turn wired to the plurality of BMC-side optical transceivers 1 . . . N. As noted above, the BMC 2305 may be provisioned as part of the BJB (not shown in FIG. 23) in an example.

Referring to FIG. 23, each of the plurality of BMC-side optical transceivers 1 . . . N is configured for optical communication with one of the plurality of module-side optical transceivers 1 . . . N. For example, each of the plurality of BMC-side optical transceivers 1 . . . N may be specifically configured with a LoS link to the respective module-side optical transceiver for which the BMC-side optical transceiver is configured for optical communication. In a specific example, each of the module-side optical transceivers 1 . . . N may be positioned so that it is directly facing its corresponding BMC-side optical transceiver, with an air gap of a few millimeters in between (e.g., whatever air gap is necessary to ensure a threshold optical alignment when all tolerances of the battery module and overall system are taken into account). This air gap could be protected from dust, debris, etc., by a compliant (e.g. foam rubber) gasket that surrounds the transceiver pair when the battery module is inserted into its respective battery module compartment.

Figure 24:
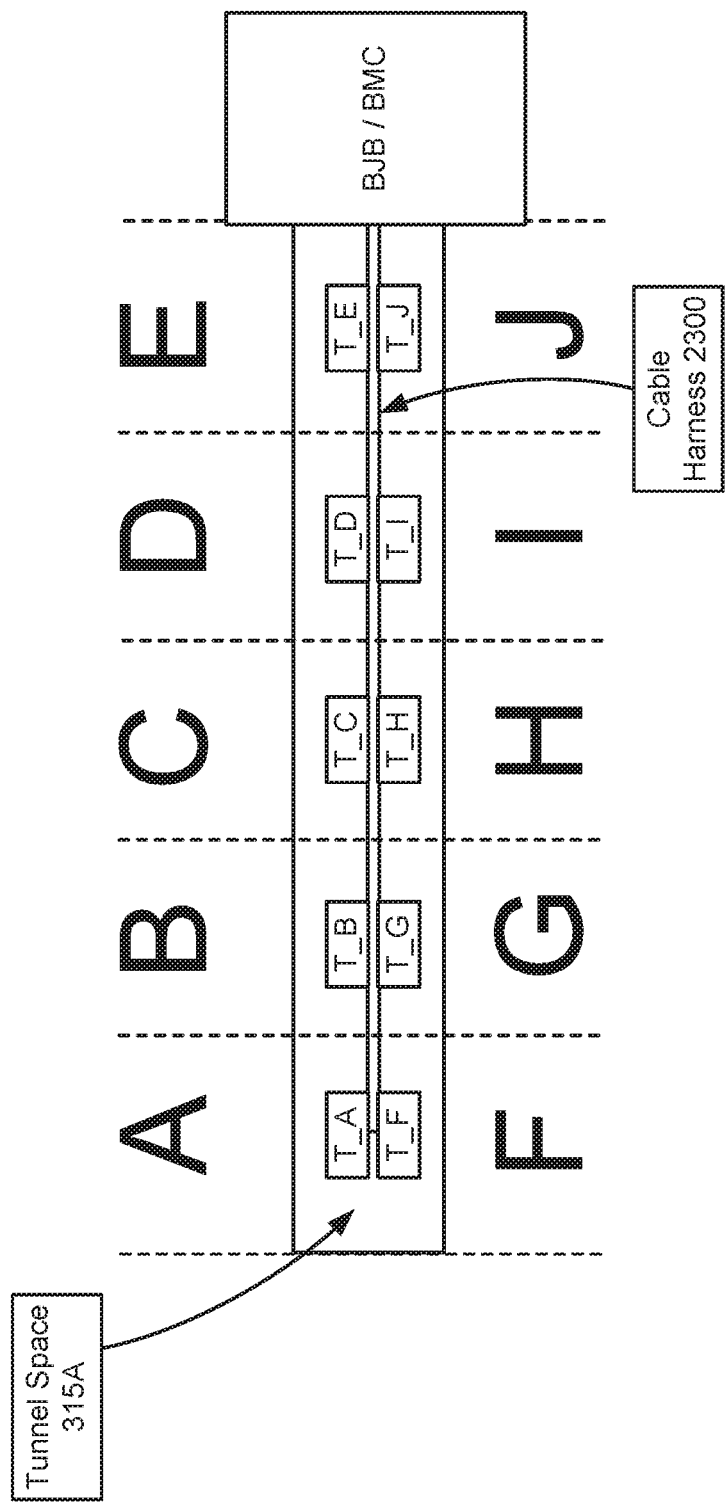
FIG. 24 illustrates the cable harness arranged along a tunnel space in accordance with an embodiment of the disclosure.

FIG. 24 illustrates the cable harness 2300 arranged along the tunnel space 315A in accordance with an embodiment of the disclosure. In FIG. 24, each of the BMC-side optical transceivers 1 . . . N from FIG. 23 are denoted with respect to the respective battery module compartment for which an optical connection is formed. So, T_A denotes the BMC-side optical transceiver configured for optical communication with the battery module in battery module compartment A, T_B denotes the BMC-side optical transceiver configured for optical communication with the battery module in battery module compartment B, and so on.

While the embodiments described above relate primarily to land-based electric vehicles (e.g., cars, trucks, etc.), it will be appreciated that other embodiments can deploy the various battery-related embodiments with respect to any type of electric vehicle (e.g., boats, submarines, airplanes, helicopters, drones, spaceships, space shuttles, rockets, etc.).

While the embodiments described above relate primarily to battery module compartments and associated battery modules and insertion-side covers for deployment as part of an energy storage system for an electric vehicle, it will be appreciated that other embodiments can deploy the various battery-related embodiments with respect to any type of energy storage system. For example, besides electric vehicles, the above-noted embodiments can be applied to energy storage systems such as home energy storage systems (e.g., providing power storage for a home power system), industrial or commercial energy storage systems (e.g., providing power storage for a commercial or industrial power system), a grid energy storage system (e.g., providing power storage for a public power system, or power grid) and so on.

As will be appreciated, the placement of the various battery module compartments in the above-noted embodiments is described as being integrated into a vehicle floor of an electric vehicle. However, it will be appreciated that the general closed compartment profile design may be extended to battery module mounting areas that can be installed in other locations within the electric vehicle (e.g., in a trunk of the electric vehicle, behind one or more car seats, under a front-hood of the electric vehicle, etc.).

The forgoing description is provided to enable any person skilled in the art to make or use embodiments of the invention. It will be appreciated, however, that the invention is not limited to the particular formulations, process steps, and materials disclosed herein, as various modifications to these embodiments will be readily apparent to those skilled in the art. That is, the generic principles defined herein may be applied to other embodiments without departing from the spirit or scope of the embodiments of the disclosure.

The invention claimed is:

1. An optical communications interface of an energy storage system, comprising:
a cable harness including a plurality of data communication cables that are coupled to a battery module controller (BMC), the cable harness being arranged inside of a tunnel space between the BMC and a plurality of battery modules; and
a plurality of BMC-side optical transceivers that are each coupled to at least one cable in the cable harness and arranged inside of the tunnel space, the plurality of BMC-side optical transceivers being configured for optical communication with a respective plurality of module-side optical transceivers that are each coupled to a different battery module among the plurality of battery modules.

2. The optical communications interface of claim 1, wherein each of the plurality of BMC-side optical transceivers is configured with a line of sight (LoS) link to the respective module-side optical transceiver for which the BMC-side optical transceiver is configured for optical communication.

3. The battery module of claim 1, wherein the energy storage system supplies power to an electric motor of an electric vehicle.

4. An optical communication bus of an energy storage system, comprising:
a light tube that facilitates a communicative coupling between (i) at least one battery module controller (BMC)-side optical transceiver coupled to a BMC, and also to (ii) a plurality of module-side optical transceivers coupled to a respective plurality of battery modules,
wherein the light tube is configured as a pipe with a hollow part through which optical signals between the at least one BMC-side optical transceiver and the plurality of module-side optical transceivers are transported.

5. The optical communication bus of claim 4,
wherein a first set of optical signals are transported between a first of the plurality of module-side optical transceivers and the at least one BMC-side optical transceiver via a line of sight (LoS) link through the hollow part of the light tube, or
wherein a second set of optical signals are transported between a second of the plurality of module-side optical transceivers and the at least one BMC-side optical transceiver via at least one deflection element arranged inside of the hollow part of the light tube, or
any combination thereof.

6. The optical communication bus of claim 4, wherein the light tube includes a plurality of connected light tube sections, each of the plurality of connected light tube sections including a set of light guide components to facilitate optical communication with a set of respective module-side optical transceivers.

7. The optical communication bus of claim 4, wherein the hollow part of the light tube includes at least one deflection element that is configured to deflect optical signals between one or more of the plurality of module-side optical transceivers and the at least one BMC-side optical transceiver.

8. The optical communications interface of claim 7, wherein the at least one deflection element includes at least one mirror.

* * * * *